United States Patent
Ikeda et al.

(10) Patent No.: US 9,916,050 B2
(45) Date of Patent: Mar. 13, 2018

(54) DISPLAY APPARATUS

(71) Applicant: Japan Display Inc., Tokyo (JP)

(72) Inventors: Masanobu Ikeda, Tokyo (JP); Koji Ishizaki, Tokyo (JP); Hayato Kurasawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 246 days.

(21) Appl. No.: 14/704,181

(22) Filed: May 5, 2015

(65) Prior Publication Data
US 2015/0338956 A1 Nov. 26, 2015

(30) Foreign Application Priority Data
May 12, 2014 (JP) .................................. 2014-098487

(51) Int. Cl.
*G06F 3/041* (2006.01)
*G06F 3/044* (2006.01)
*H05K 1/02* (2006.01)

(52) U.S. Cl.
CPC .............. *G06F 3/044* (2013.01); *G06F 3/041* (2013.01); *G06F 3/0412* (2013.01); *G06F 3/0416* (2013.01); *H05K 1/0298* (2013.01); *G06F 2203/04112* (2013.01);
(Continued)

(58) Field of Classification Search
CPC ........... G06F 2203/04112; G06F 3/041; G06F 3/0412; G06F 3/0416; G06F 3/044; H05K 1/0298; H05K 2201/09245; H05K 2201/10128; H05K 2201/10166
See application file for complete search history.

(56) References Cited

U.S. PATENT DOCUMENTS

| 7,068,418 B2 * | 6/2006 | Kawase | H01L 27/3262 345/60 |
| 2006/0197943 A1 * | 9/2006 | Kewitsch | G01J 1/04 356/73.1 |
| 2010/0214262 A1 | 8/2010 | Ishizaki et al. | |

(Continued)

FOREIGN PATENT DOCUMENTS

| JP | 2010-197576 A | 9/2010 |
| JP | 2011-253263 A | 12/2011 |

*Primary Examiner* — Ram Mistry
(74) *Attorney, Agent, or Firm* — Michael Best & Friedrich LLP

(57) ABSTRACT

[PROBLEM] To reduce a time constant of an electric circuit including driving electrodes and detecting electrodes in a display provided with an input device, and reduce a temperature variation ratio of the time constant.
[SOLVING MEANS] The display 1 includes driving electrodes COML provided along an X axis direction when seen in a plan view, buffer TFT elements Trb serially connected to the driving electrodes COML, and a plurality of detecting electrodes TDL respectively provided to intersect with the driving electrodes COML when seen in a plan view and aligned in the X axis direction. A temperature coefficient of resistance of a sum of an ON resistance of the buffer TFT elements Trb and a resistance of the driving electrodes COML is negative, each of the specific resistances of the plurality of detecting electrodes TDL is not more than 40 $\mu\Omega cm$, and each of the temperature coefficients of resistance of the plurality of detecting electrodes TDL is $1\times10^{-3}$ to $5\times10^{-3} K^{-1}$.

3 Claims, 18 Drawing Sheets

(52) U.S. Cl.
CPC ............ *H05K 2201/09245* (2013.01); *H05K 2201/10128* (2013.01); *H05K 2201/10166* (2013.01)

(56) References Cited

U.S. PATENT DOCUMENTS

| | | | |
|---|---|---|---|
| 2012/0299863 A1* | 11/2012 | Yilmaz | G06K 19/07758 |
| | | | 345/174 |
| 2012/0313873 A1* | 12/2012 | Bright | G06F 3/044 |
| | | | 345/173 |
| 2013/0278528 A1 | 10/2013 | Ishizaki et al. | |
| 2014/0104510 A1* | 4/2014 | Wang | G06F 3/0412 |
| | | | 349/12 |
| 2014/0225840 A1* | 8/2014 | Jamshidi-Roudbari | G06F 3/044 |
| | | | 345/173 |
| 2015/0103276 A1 | 4/2015 | Ishizaki et al. | |
| 2015/0103277 A1 | 4/2015 | Ishizaki et al. | |
| 2015/0357077 A1* | 12/2015 | Sasa | C23C 14/34 |
| | | | 428/336 |

\* cited by examiner

DISPLAY APPARATUS

TECHNICAL FIELD

The present invention relates to a display, and particularly relates to a display having an electrostatic capacitive input device.

BACKGROUND ART

In recent years, a technique of attaching an input device referred to as a touch panel or a touch sensor to a display surface side of a display and detecting and outputting an input position when input operations are performed by contacting the touch panel with a finger or an input tool such as a touch pen has been known. Since such displays including a touch panel do not require input devices such as a keyboard, a mouse and a keypad, they are widely used in portable information terminals such as mobile phones in addition to computers.

One detecting method for detecting contact positions at which a finger or the like has contacted the touch panel is the electrostatic capacitance method. In an electrostatic capacitive touch panel, a plurality of capacitive elements each made up of a pair of electrodes arranged to be opposed to each other with a dielectric layer interposed therebetween, that is, made up of a driving electrode and a detecting electrode are provided in a plane of the touch panel. Then, the input positions are detected by utilizing the characteristics that the electrostatic capacitance of capacitive elements changes when performing input operations by contacting the capacitive elements with a finger or an input tool such as a touch pen.

For instance, Japanese Patent Application Laid-Open No. 2011-253263 (Patent Document 1) recites a touch panel having a first conductive portion including a plurality of first grid electrodes connected in a first direction and a second conductive portion including a plurality of second grid electrodes connected in a second direction. Patent Document 1 recites that the first conductive portion and the second conductive portion are formed by forming a metallic material (silver). Further, Japanese Patent Application Laid-Open No. 2010-197576 (Patent Document 2) recites a display including detecting electrodes arranged on a surface opposing driving electrodes and separately arranged at a pitch which corresponds to a multiple of a natural number of pixels in one direction of aligning pixels electrodes.

RELATED ART DOCUMENT

Patent Document

[Patent Document 1] Japanese Patent Application Laid-Open No. 2011-253263
[Patent Document 2] Japanese Patent Application Laid-Open No. 2010-197576

DISCLOSURE OF THE INVENTION

Problems to be Solved by the Invention

When input positions are detected by detecting electrostatic capacities between driving electrodes and detecting electrodes, electrostatic capacities between driving electrodes and detecting electrodes are detected by inputting signals formed, for instance, of rectangular waves to the driving electrodes and by detecting signals output from the detecting electrodes. In this case, the detection performance of detecting electrostatic capacities can be improved, the larger the number of waveforms of the signals input to the driving electrodes within a predetermined period of time is. That is, the shorter periods of signals input to the driving electrodes are, the more the detection performance of the input device can be improved. Further, for improving the detection performance of the input device, it is important to make a time constant of an electric circuit including the driving electrodes and the detecting electrodes small.

However, the time constant of the electric circuit including the driving electrodes and the detecting electrodes is determined by a plurality of resistance components and electrostatic capacity components such as resistance components of the driving electrodes and their routing wirings, resistance components of the detecting electrodes and their routing wirings, and electrostatic capacity components between the driving electrodes and the detecting electrodes. Accordingly, when any of the plurality of resistance components and electrostatic capacity components is large, it is difficult to make the time constant of the electric circuit including the driving electrodes and the detecting electrodes small. When the time constant cannot be made small, delays are caused in signals output to the detecting electrodes accompanying signals input to the driving electrodes, so that it is difficult to increase the number of waveforms of signals input to the driving electrodes within a predetermined period of time and it is hard to improve the detection performance of the input device.

Further, when a temperature variation ratio of any of the plurality of resistance components and the electrostatic capacity components is large, it is difficult to maintain a constant time constant over the entire range of an assumed temperature range for the display to be used and it is hard to ensure reliability of the display.

The present invention has been made for solving the above-described problems of the prior art, and it is an object thereof to provide a display capable of making a time constant of an electric circuit including driving electrodes and detecting electrodes small and of making a time variation ratio of the time constant small in a display provided with an input device including driving electrodes and detecting electrodes.

Means for Solving the Problems

The following is a brief description of an outline of the typical invention disclosed in the present application.

A display as an aspect of the present invention includes a first substrate, a second substrate arranged to oppose the first substrate, and a plurality of pixels provided on the first substrate. Further, the display includes first electrodes provided on the first substrate along a first direction when seen in a plan view, a transistor provided on the first substrate and serially connected to the first electrodes, and a plurality of second electrodes provided on the second substrate to respectively intersect with the first electrodes when seen in a plan view and aligned in the first direction. Input positions are detected based on electrostatic capacities between each of the first electrodes and the plurality of second electrodes. A temperature coefficient of resistance of a first resistance which is a sum of an ON resistance of the transistor and a resistance of the first electrodes is negative, each of specific resistances of the plurality of second electrodes is not more than 40 μΩcm, and each of temperature coefficients of resistance of the plurality of second electrodes is $1\times10^{-3}$ to $5\times10^{-3}K^{-1}$.

BEST MODE FOR CARRYING OUT THE INVENTION

Figure 1:
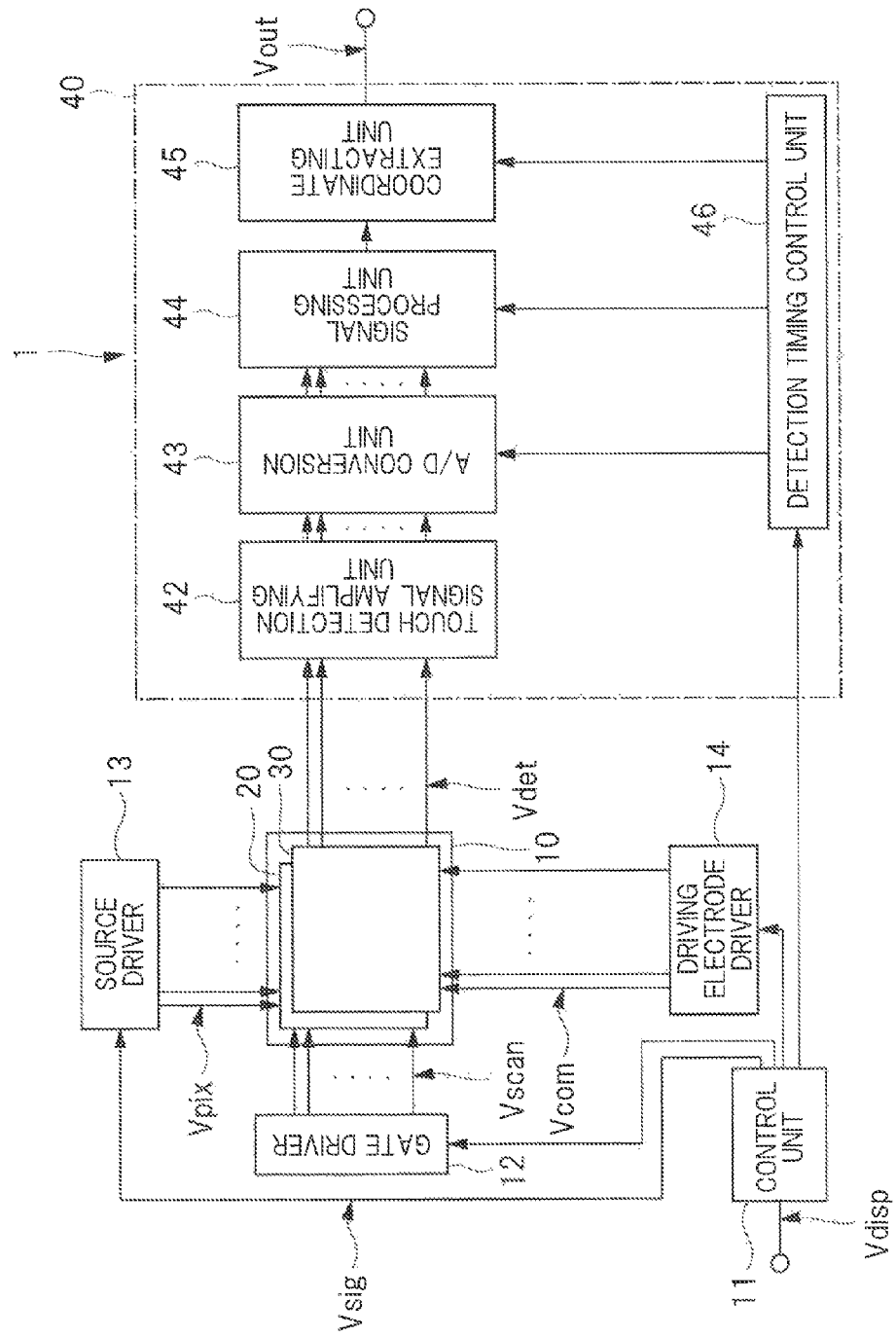
FIG. 1 A block diagram showing one configuration example of a display according to a first embodiment.

Hereinafter, embodiments of the present invention will be described with reference to drawings.

Note that the disclosures are provided by way of example, and any suitable variations easily conceived by a person with ordinary skill in the art while pertaining to the gist of the invention are of course included in the scope of the present invention. Further, in the drawings, widths, thicknesses and shapes of respective components may be schematically illustrated in comparison with the embodiments for the purpose of making the description more clearly understood, but these are merely examples, and do not limit the interpretations of the present invention.

Further, in the specification and drawings, elements which are similar to those already mentioned with respect to previous drawings are denoted by the same reference characters, and detailed descriptions thereof will be suitably omitted.

Further, in some drawings used in the embodiments, hatching is omitted in some cases even in a cross-sectional view so as to make the drawings easy to see. Still further, hatching is used in some cases even in a plan view so as to make the drawings easy to see.

In the case where a range is indicated as A to Bin the following embodiment, it is assumed to be A or more and B or less except for the cases where it is clearly indicated in particular.

(First Embodiment)

First, an example in which a display provided with a touch panel as an input device is applied to a liquid crystal display with touch detection functions of in cell type will be explained as a first embodiment. In the present specification, an input device is an input device which detects electrostatic capacities which change at least depending on capacities of objects that approach or contact electrodes. Further, a liquid crystal display with touch detection functions is a liquid crystal display provided with detecting electrodes for touch detection on either an array substrate 2 or an opposing substrate 3 which form the display. Moreover, in the first embodiment, a display with touch detection functions of in cell type characterized in that driving electrodes operate as driving electrodes of the display and as driving electrodes of the input device will be described.

<Overall Configuration>

First, the overall configuration of the display according to the first embodiment will be described with reference to FIG. 1. FIG. 1 is a block diagram showing one configuration example of a display according to the first embodiment.

A display 1 is provided with a display device with touch detection functions 10, a control unit 11, a gate driver 12, a source driver 13, a driving electrode driver 14, and a touch detection unit 40.

The display device with touch detection functions 10 includes a display device 20 and a touch detection device 30. In the first embodiment, the display device 20 is a display device using liquid crystal display elements as display elements. Accordingly, the display device 20 might also be referred to as a liquid crystal display device 20 in the following descriptions. The touch detection device 30 is a touch detection device of electrostatic capacity method, namely a touch detection device of electrostatic capacity type. Therefore, the display 1 is a display provided with an input device with touch detection functions. The display device with touch detection functions 10 is a display device in which the liquid crystal display device 20 and the touch detection device 30 are integrated, and is a display device incorporating touch detection functions, namely, a display device with touch detection functions of in cell type.

Further, the display device with touch detection functions 10 may be a display device in which the touch detection device 30 is attached on the display device 20. Further, the display device 20 may be an organic EL (Electroluminescence) display device instead of a display device using liquid crystal display elements.

The display device 20 performs display by sequentially scanning each horizontal line in the display region in accordance with scanning signals Vscan supplied from the gate driver 12. The touch detection device 30 operates in accordance with a principle of electrostatic capacitive type touch detection and outputs detecting signals Vdet, as will be described later.

The control unit 11 is a circuit which respectively supplies control signals to the gate driver 12, the source driver 13, the driving electrode driver 14 and the touch detection unit 40 based on video signals Vdisp supplied from the exterior to perform control so that they are operated in synchronization with each other.

The gate driver 12 has a function of sequentially selecting one horizontal line, which is an object of display driving of the display device with touch detection functions 10, based on control signals supplied from the control unit 11.

The source driver 13 is a circuit which supplies pixel signals Vpix to sub-pixels SPix (see FIG. 7 to be described later) included in the display device with touch detection functions 10 based on control signals of image signals Vsig supplied from the control unit 11.

The driving electrode driver 14 is a circuit which supplies driving signals Vcom to driving electrodes COML (see FIG. 5 or FIG. 6 to be described later) included in the display device with touch detection functions 10 based on control signals supplied from the control unit 11.

The touch detection unit 40 is a circuit which detects presence/absence of touches of a finger or an input tool such as a touch pen to the touch detection device 30, namely, presence/absence of a state of contact or approach to be described later based on control signals supplied from the control unit 11 and detecting signals Vdet supplied from the touch detection device 30 of the display device with touch detection functions 10. Also, the touch detection unit 40 is a circuit which obtains coordinates of touches, namely input positions in the touch detection region in the case where the touches are present. The touch detection unit 40 is provided with a touch detecting signal amplifying unit 42, an A/D (Analog/Digital) converting unit 43, a signal processing unit 44, a coordinate extracting unit 45 and a detection timing control unit 46.

The touch detecting signal amplifying unit 42 amplifies detecting signals Vdet supplied from the touch detection device 30. The touch detecting signal amplifying unit 42 may be provided with a low pass analog filter which removes high frequency components, namely, noise components included in the detecting signals Vdet and extracts and respectively outputs touch components.

<Principle of Electrostatic Capacity Type Touch Detection>

Figure 2:
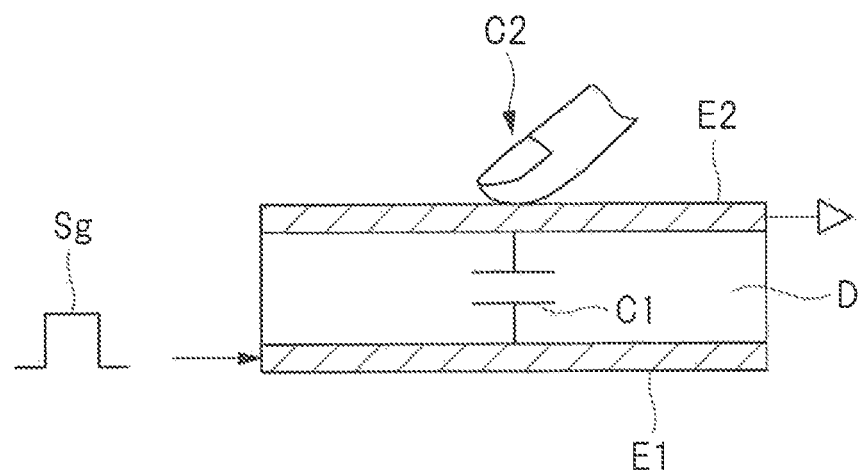
FIG. 2 An explanatory view showing a state of a finger which has contacted or approached a touch detection device.
Figure 3:
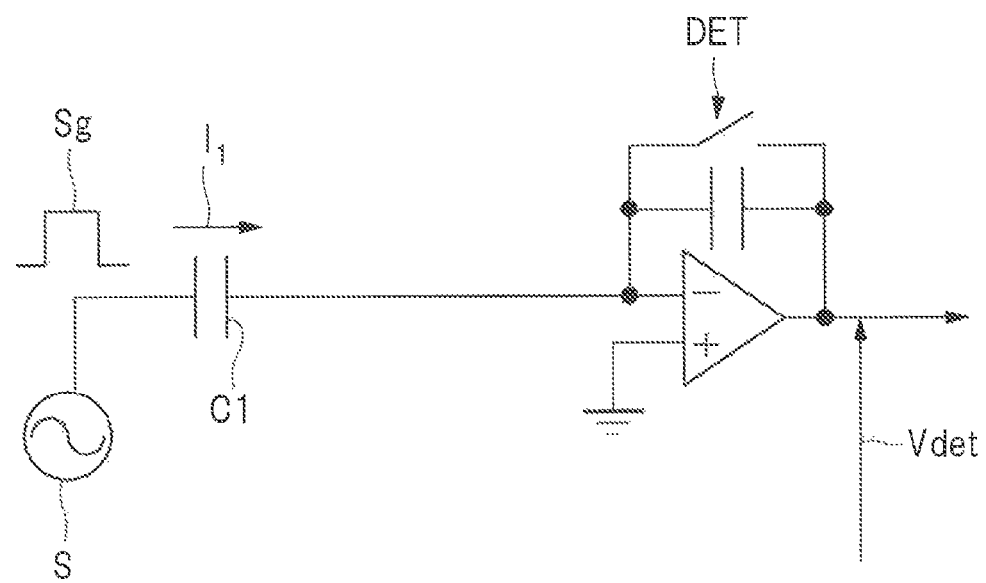
FIG. 3 An explanatory view showing an example of an equivalent circuit in a state of the finger which has contacted or approached the touch detection device.
Figure 4:
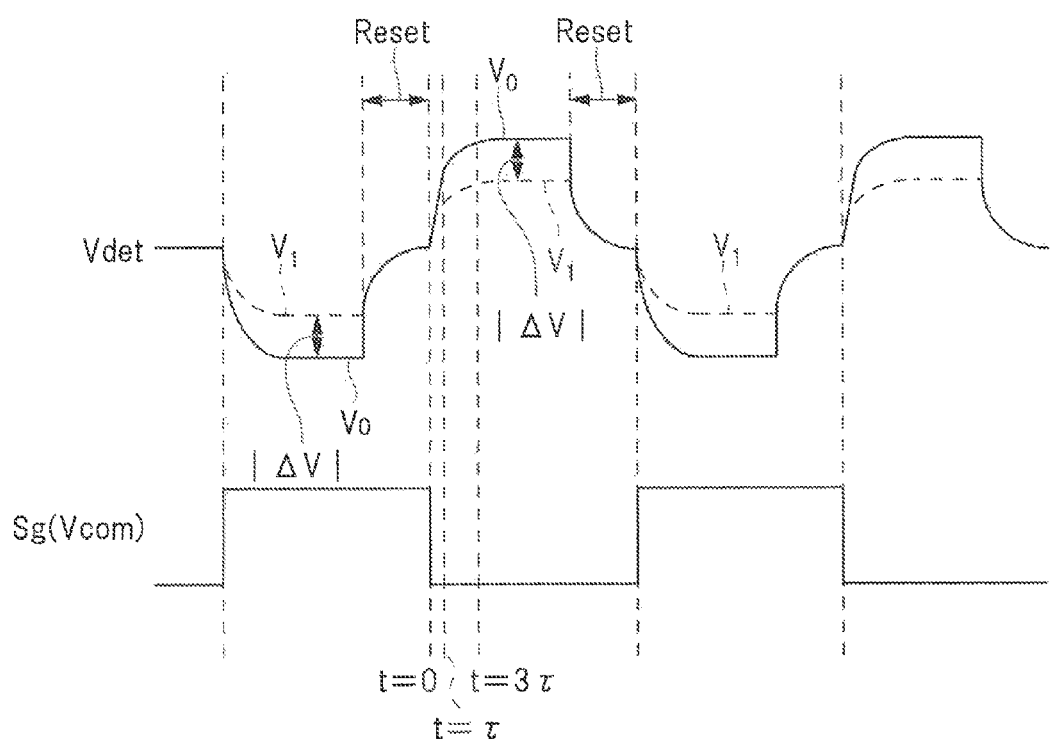
FIG. 4 A diagram showing examples of waveforms of driving signals and detecting signals.

A principle of touch detection in the display 1 according to the first embodiment will be explained with reference to FIG. 1 to FIG. 4. FIG. 2 is an explanatory view showing a state of a finger which has contacted or approached the touch detection device. FIG. 3 is an explanatory view showing an example of an equivalent circuit in a state of the finger which has contacted or approached the touch detection device. FIG. 4 is a diagram showing examples of waveforms of driving signals and detecting signals.

As shown in FIG. 2, in electrostatic capacity type touch detection, an input device referred to as a touch panel or touch sensor includes driving electrodes E1 and detecting electrodes E2 arranged to oppose each other with a dielectric body D interposed therebetween. Capacitive elements C1 are formed by the driving electrodes E1 and the detecting electrodes E2. As shown in FIG. 3, one ends of the capacitive elements C1 are connected to an alternating signal source S as a driving signal source while the other ends of the capacitive elements C1 are connected to a voltage detector DET which is the touch detection unit. The voltage detector DET includes, for instance, an integrating circuit included in the touch detecting signal amplifying unit 42 shown in FIG. 1.

When alternating rectangular waves Sg having, for instance, a frequency in the range of several kHz to several hundreds of kHz are applied from the alternating signal source S to the one ends of the capacitive elements C1, namely to the driving electrodes E1, detecting signals Vdet which are output waveforms are generated by means of voltage detector DET connected to the other ends of the capacitive elements C1, namely the detecting electrodes E2 side. In this respect, the alternating rectangular waves Sg correspond to the driving signals Vcom which are, for instance, shown in FIG. 4.

In a state no finger has contacted or approached, namely in a non-contact state, current $I_1$ corresponding to the capacity value of the capacitive elements C1 is made to flow in accordance with discharge and charge of the capacitive elements C1 as shown in FIG. 3. The voltage detector DET converts fluctuations in the current $I_1$ in accordance with the alternating rectangular waves Sg into fluctuations in voltage. These voltage fluctuations are shown as waveforms $V_0$ indicated by solid lines in FIG. 4.

On the other hand, in a state a finger has contacted or approached, namely in a contact state, the capacity value of the capacitive elements C1 which are formed of the driving electrodes E1 and detecting electrodes E2 becomes small being affected by the electrostatic capacity C2 which is formed by the finger. Accordingly, the current $I_1$ flowing through the capacitive elements C1 as shown in FIG. 3 fluctuates. The voltage detector DET converts fluctuations in the current $I_1$ in accordance with the alternating rectangular waves Sg into fluctuations in voltage. These voltage fluctuations are shown as waveforms $V_1$ indicated by broken lines in FIG. 4. In this case, the amplitude of waveforms $V_1$ is smaller than that of the above-described waveforms $V_0$. With this arrangement, absolute values $|\Delta V|$ of voltage differences between the waveforms $V_0$ and waveforms $V_1$ will change in accordance with influences of an object such as a finger which approaches from the exterior. In this respect, in order to accurately detect absolute values $|\Delta V|$ of voltage differences between the waveforms $V_0$ and waveforms $V_1$, it is preferable that the voltage detector DET operates while providing periods Reset during which discharge and charge of the condenser is reset so as to match frequencies of the alternating rectangular waves Sg through switching within the circuit.

As shown in FIG. 4, while the waveforms of the alternating rectangular waves Sg are steep, the waveforms of the detecting signals Vdet converted by the voltage detector DET are not steep, and delays occur in rise times of the detecting signals Vdet when compared to changes in the alternating rectangular waves Sg. The degree of delay is dependent on the size of the time constant τ which will be explained later using FIG. 11. The larger the time constant τ is, the larger the delay in the rise time of the detecting signals Vdet will be.

In the example shown in FIG. 1, the touch detection device 30 performs touch detection for each detection block corresponding to one or a plurality of driving electrodes COML (see FIG. 5 or FIG. 6 to be described later) in accordance with driving signals Vcom which are supplied from the driving electrode driver 14. Namely, the touch detection device 30 outputs detecting signals Vdet by means of the voltage detector DET shown in FIG. 3 for each detection block corresponding to one or each of the plurality of the driving electrodes COML, and the output detecting signals Vdet are supplied to the touch detection signal amplifying unit 42 of the touch detector unit 40.

The A/D conversion unit 43 is a circuit which performs sampling of respective analog signals which are output from the touch detection signal amplifying unit 42 at timings which are in sync with the detecting signals Vdet and converts them into digital signals.

The signal processing unit 44 is provided with a digital filter for reducing frequency components other than frequencies of which driving signals Vcom have been sampled, namely noise components, included in the output signals of the A/D conversion unit 43. The signal processing unit 44 is a logic circuit which detects the presence/absence of touch with respect to the touch detection device 30 based on output signals of the A/D conversion unit 43. The signal processing unit 44 performs processes of extracting only differential voltages caused by the finger. The differential voltages caused by the finger are the above-described absolute values $|\Delta V|$ of differences between the waveforms $V_0$ and waveforms $V_1$. It is also possible that the signal processing unit 44 performs calculations of averaging absolute values $|\Delta V|$ per each detection block to obtain average values of the absolute values $|\Delta V|$. With this arrangement, the signal processing unit 44 can reduce influences of noise. The signal processing unit 44 compares the detected differential voltage caused by the finger with a predetermined threshold voltage, and when the voltage is not less than the threshold voltage, it is determined that a contact state of an externally approaching object approaching from the exterior is present, and when it is less than the threshold voltage, it is determined that a non-contact state of an externally approaching object is present. In this manner, touch detection is performed by the touch detection unit 40.

The coordinate extracting unit 45 is a logic circuit which obtains coordinates of a position at which touch has been detected, namely an input position on the touch panel upon detection of a touch by the signal processing unit 44. The detection timing control unit 46 performs control such that the A/D conversion unit 43, the signal processing unit 44 and the coordinate extracting unit 45 operate in sync with each other. The coordinate extracting unit 45 outputs the touch panel coordinates as signal outputs Vout.

<Module>

Figure 5:
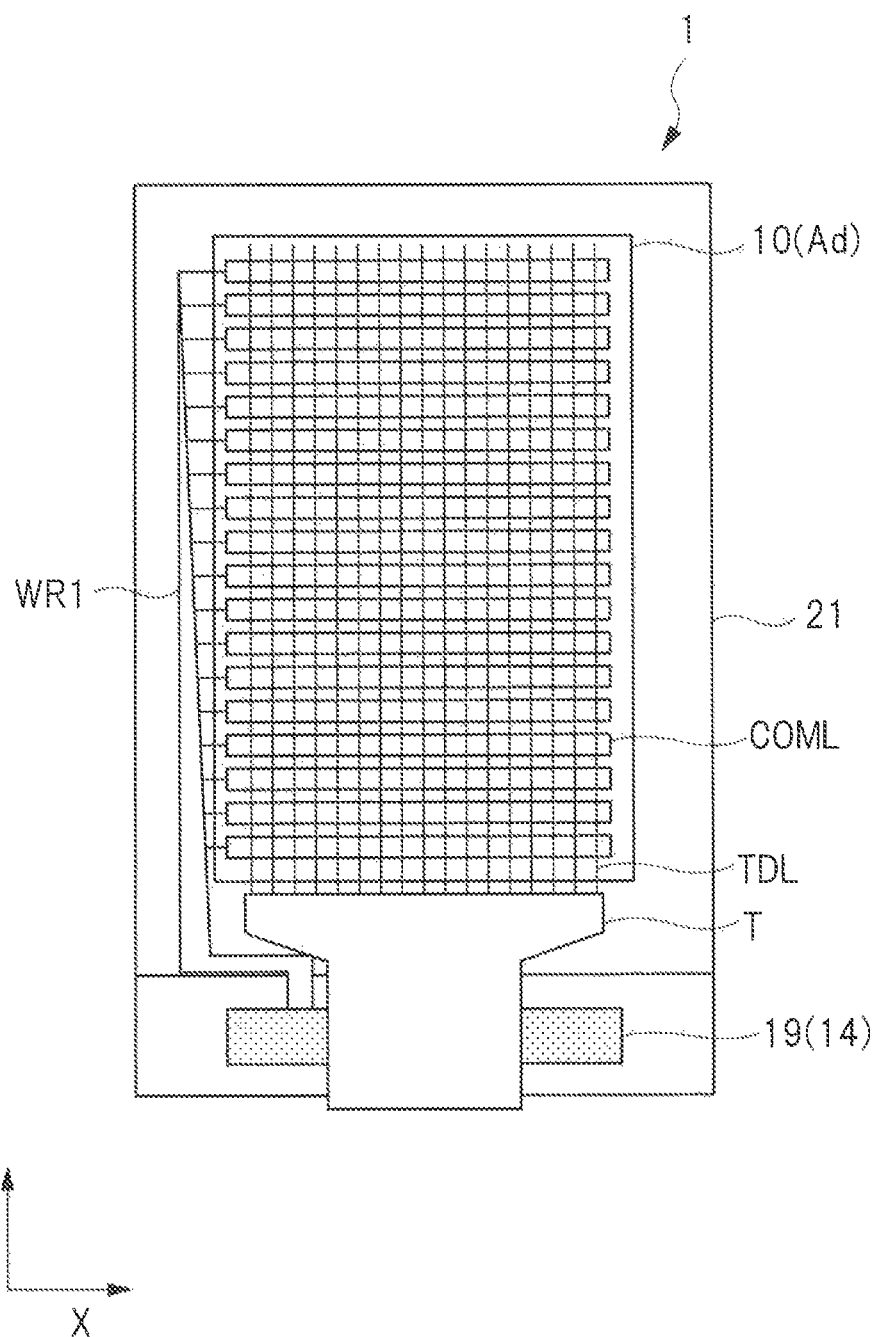
FIG. 5 A plan view showing one example of a module mounted with the display according to the first embodiment.

FIG. 5 is a plan view showing one example of a module mounted with the display according to the first embodiment. In the example shown in FIG. 5, the above-described driving electrode driver 14 is formed on a transparent substrate 21.

As shown in FIG. 5, the display 1 includes a display device with touch detection functions 10, a COG (Chip on Glass) 19 and the transparent substrate 21.

In this respect, in the present specification, the expression "transparent" of the transparent substrate indicates that the transmittance with respect to visible light is, for instance, not less than 80%.

The display device with touch detection functions 10 includes a plurality of driving electrodes COML and a plurality of detecting electrodes TDL. Here, two directions which intersect with each other and which are preferably orthogonal within the upper surface as a main surface of the transparent substrate 21 are defined as an X axis direction and a Y axis direction. At this time, each of the plurality of driving electrodes COML extends in the X axis direction when seen in a plan view and is aligned in the Y axis direction. Accordingly, each of the plurality of driving electrodes COML is provided to be along the X axis direction when seen in a plan view. Further, each of the plurality of detecting electrodes TDL extends in the Y axis direction when seen in a plan view and is aligned in the X axis direction. In other words, each of the plurality of detecting electrodes TDL intersects with each of the plurality of driving electrodes COML and is aligned in the X axis direction when seen in a plan view. Accordingly, each of the plurality of detecting electrodes TDL is provided to intersect with each of the plurality of driving electrodes COML when seen in a plan view.

As it will be described later using FIG. 7, each of the plurality of driving electrodes COML is provided to overlap a plurality of sub-pixels SPix aligned in the X axis direction when seen in a plan view. Namely, one driving electrode COML is provided as a common electrode of the plurality of sub-pixels SPix.

In this respect, in the present specification, the expression "when seen in a plan view" indicates that objects are seen from a direction perpendicular to the upper surface as the main surface of the transparent substrate 21 or a transparent substrate 31 included in the opposing substrate 3 to be described later.

In the example shown in FIG. 5, the display device with touch detection functions 10 has a rectangular shape including two sides respectively extending in the X axis direction and opposing each other when seen in a plan view and two sides respectively extending in the Y axis direction and opposing each other when seen in a plan view. A terminal unit T is provided on one side of the display device with touch detection functions 10 in the Y axis direction. The detecting electrodes TDL are connected to the touch detection unit 40 mounted to the exterior of the module via the terminal unit T.

The COG 19 is a chip mounted to the transparent substrate 21, and incorporates circuits necessary for display operations such as the control unit 11, the gate driver 12 or the source driver 13 as shown in FIG. 1. The COG 19 might also incorporate the driving electrode driver 14. The COG 19 and each of the plurality of driving electrodes COML are electrically connected through routing wirings WR1. In this respect, as it will be described later using FIG. 11, each of the plurality of driving electrodes COML and each of the plurality of routing wirings WR1 are electrically connected via buffer TFT elements Trb.

In this respect, it is possible to use various substrates such as a glass substrate with transparency or a film made of resin, as the transparent substrate 21.

<Display Device with Touch Detection Functions>

Figure 6:
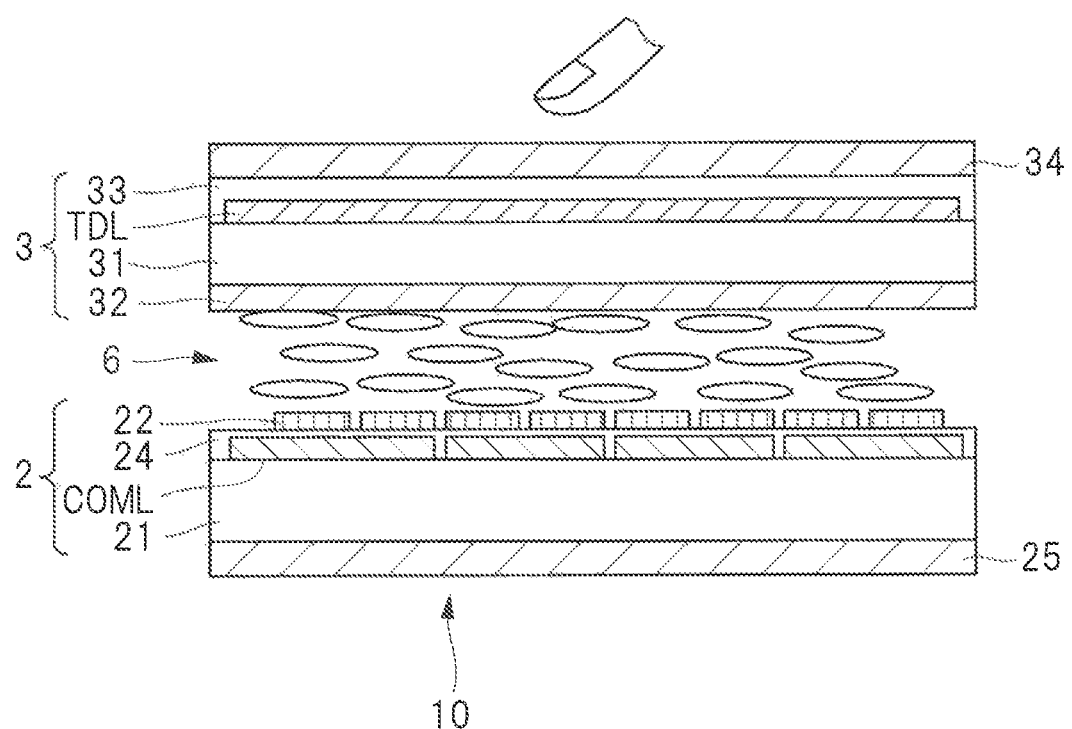
FIG. 6 A cross-sectional view showing a display device with touch detection functions in the display according to the first embodiment.

Next, a configuration example of the display device with touch detection functions 10 will be explained in details. FIG. 6 is a cross-sectional view showing a display device with touch detection functions in the display according to the first embodiment. FIG. 7 is a circuit diagram showing a display device with touch detection functions in the display according to the first embodiment.

The display device with touch detection functions 10 includes the array substrate 2, the opposing substrate 3 and a liquid crystal layer 6. The opposing substrate 3 is arranged such that the upper surface as the main surface of the array substrate 2 and the lower surface as the main surface of the opposing substrate 3 oppose each other. The liquid crystal layer 6 is provided between the array substrate 2 and the opposing substrate 3.

The array substrate 2 includes the transparent substrate 21. As shown in FIG. 7, in the display region Ad, the transparent substrate 21 is formed with a plurality of scanning lines GCL, a plurality of signal lines SGL and a plurality of TFT elements Tr which are thin film transistors (TFT). In this respect, in FIG. 6, illustration of the scanning lines GCL, the signal lines SGL and the TFT elements TR is omitted.

Figure 7:
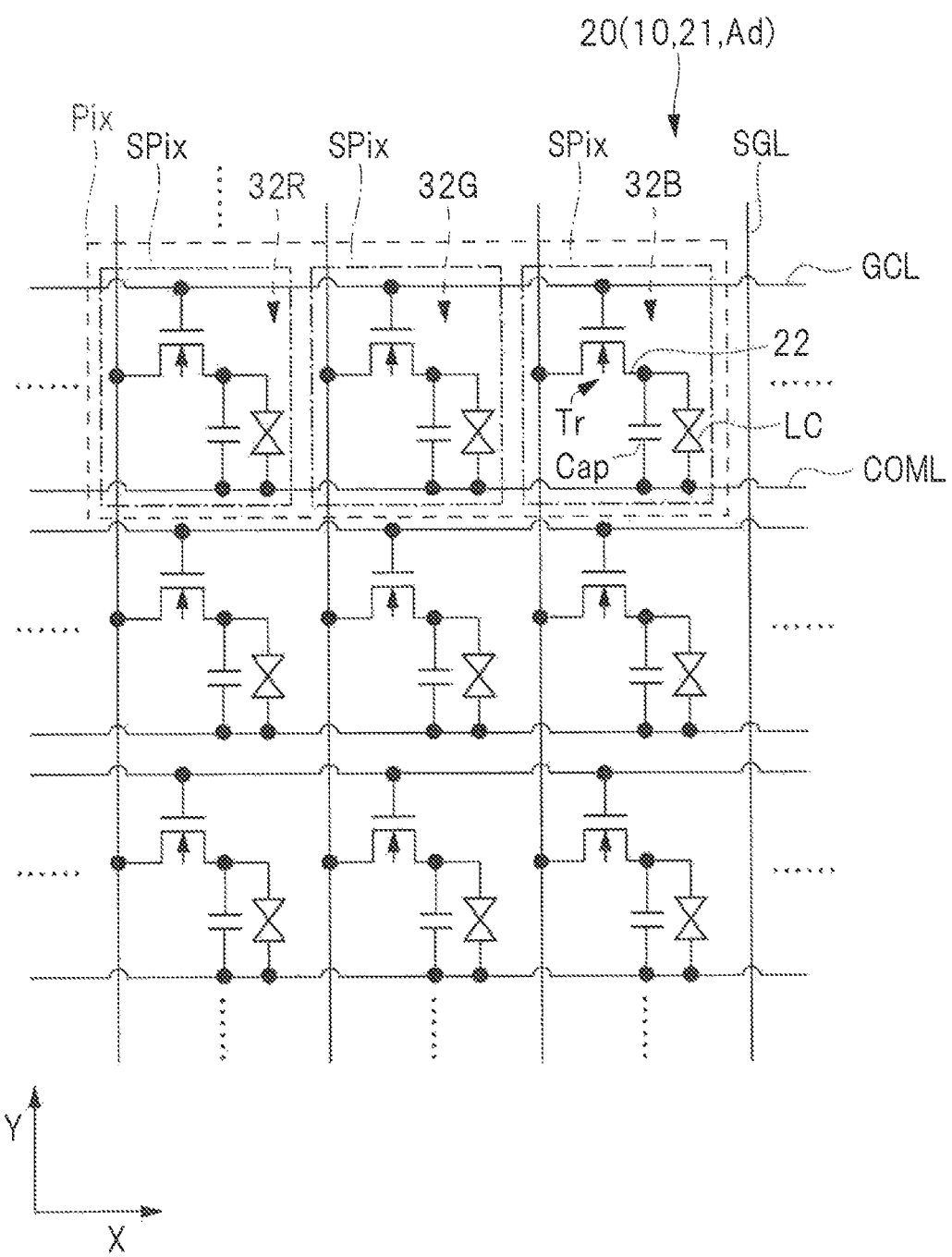
FIG. 7 A circuit diagram showing a display device with touch detection functions in the display according to the first embodiment.

As shown in FIG. 7, each of the plurality of scanning lines GCL extends in the X axis direction and is aligned in the Y axis direction in the display region Ad. Each of the plurality of signal lines SGL extends in the Y axis direction and is aligned in the X axis direction in the display region Ad. Accordingly, each of the plurality of signal lines SGL intersects with the plurality of scanning lines GCL when seen in a plan view. In this manner, sub-pixels SPix are arranged at intersections of the plurality of scanning lines GCL and the plurality of signal lines SGL which mutually intersect when seen in a plan view and a single pixel Pix is formed by a plurality of sub-pixels SPix of different colors. Namely, the plurality of sub-pixels SPix are aligned in a matrix-like form in the X axis direction and the Y axis direction on the transparent substrate 21 in the display region Ad. In other words, the sub-pixels SPix are aligned in a matrix-like form in the X axis direction and the Y axis direction in the display region Ad on the surface side of the transparent substrate 21.

The TFT elements Tr are formed at intersecting portions at which each of the plurality of scanning lines GCL and each of the plurality of signal lines SGL intersect when seen in a plan view. Accordingly, in the display region Ad, the plurality of TFT elements Tr are formed on the transparent substrate 21, and the plurality of TFT elements are aligned in a matrix-like form in the X axis direction and the Y axis direction. Namely, each of the plurality of sub-pixels SPix is provided with a TFT element Tr. In addition to the TFT elements Tr, each of the plurality of sub-pixels SPix is provided with a liquid crystal element LC.

The TFT elements Tr are composed, for instance, of a thin film transistor as a MOS (metal oxide semiconductor) of n-channel type. Gate electrodes of the TFT elements Tr are connected with the scanning lines GCL. Either one of a source electrode or the drain electrode of the TFT element Tr is connected with the scanning line GCL. The other one of the source electrode or the drain electrode of the TFT element Tr is connected with one end of the liquid crystal element LC. The liquid crystal element LC is arranged in that, for instance, one end thereof is connected with the source electrode or the drain electrode of the TFT element Tr while the other end is connected with the driving electrode COML.

As shown in FIG. 6, the array substrate 2 includes the plurality of driving elements COML, an insulating film 24 and a plurality of pixel electrodes 22. The plurality of driving electrodes COML are provided on the transparent substrate 21 in the display region Ad (see FIG. 5) on the surface side of the transparent substrate 21. The insulating film 24 is formed on the transparent substrate 21 including surfaces of each of the plurality of driving electrodes COML. In the display region Ad, the plurality of pixel electrodes 22 are formed on the insulating film 24. Accordingly, the insulating film 24 electrically insulates the driving electrodes COML and the pixel electrodes 22.

As shown in FIG. 7, the plurality of pixel electrodes 22 are formed within each of the plurality of sub-pixels SPix aligned in a matrix-like form in the X axis direction and the Y axis direction in the display region Ad on the surface side of the transparent substrate 21. Accordingly, the plurality of pixel electrodes 22 are aligned in a matrix-like form in the X axis direction and the Y axis direction.

In the example shown in FIG. 6, each of the plurality of driving electrodes COML is formed between the transparent substrate 21 and the pixel electrodes 22. Further, as schematically shown in FIG. 7, each of the plurality of driving electrodes COML is provided to overlap the plurality of pixel electrodes 22 when seen in a plan view. Then, by applying voltage between each of the plurality of pixel electrodes 22 and each of the plurality of driving electrodes COML such that an electric field is formed at the liquid crystal elements LC provided in each of the plurality of sub-pixels SPix, an image is displayed in the display region Ad. At this time, a capacity Cap is formed between the driving electrodes COML and the pixel electrodes 22 and the capacity Cap functions as a retention volume.

In this manner, when the display device with touch detection functions 10 includes the liquid crystal display device 20, a display control unit which controls display of images is formed by the liquid crystal elements LC, the plurality of pixel electrodes 22, the driving electrodes COML, the plurality of scanning lines GCL and the plurality of signal lines SGL. The display control unit is provided between the array substrate 2 and the opposing substrate 3. In this respect, the display device with touch detection functions 10 might also include a display device as one of various displays such as an organic EL display instead of the liquid crystal display device 20 as the liquid crystal display.

In this respect, each of the plurality of driving electrodes COML might also be formed on the opposite side of the transparent substrate 21 with the pixel electrodes 22 being interposed therebetween. In the example shown in FIG. 6, the arrangement of the driving electrodes COML and the pixel electrodes 22 is an arrangement of a FFS (fringe field switching) mode as a horizontal field mode. However, the arrangement of the driving electrodes COML and the pixel electrodes 22 might also be an arrangement of an IPS (in plane switching) mode as a horizontal field mode in which the driving electrodes COML and the pixel electrodes 22 do not overlap when seen in a plan view.

The liquid crystal layer 6 is to demodulate light passing therethrough in accordance with states of the electric field, and a liquid crystal layer corresponding to the horizontal field mode such as the above-described FFS mode or the IPS mode is used. Namely, a liquid crystal device of horizontal electric field mode such as the FFS mode or the IPS mode is used as the liquid crystal display device 20. In this respect, there might be respectively provided alignment films between the liquid crystal layer 6 and the array substrate 2 and between the liquid crystal layer 6 and the opposing substrate 3 shown in FIG. 6.

As shown in FIG. 7, the plurality of sub-pixels SPix which are aligned in the X axis direction, namely the plurality of sub-pixels SPix which belong to the same row of the liquid crystal display device 20 are connected with each other by means of the scanning lines GCL. The scanning lines GCL are connected with the gate driver 12 (see FIG. 1) and are supplied with scanning signals Vscan (see FIG. 1) by the gate driver 12. Further, the plurality of sub-pixels SPix which are aligned in the Y axis direction, namely the plurality of sub-pixels SPix which belong to the same column of the liquid crystal display device 20 are connected with each other by means of the signal lines SGL. The signal lines SGL are connected with the source driver 13 (see FIG. 1) and are supplied with pixel signals Vpix (see FIG. 1) by the source driver 13.

The driving electrodes COML are connected with the driving electrode driver 14 (see FIG. 1) and are supplied with driving signals Vcom (see FIG. 1) by the driving electrode driver 14. That is, in the example shown in FIG. 7, the plurality of sub-pixels SPix which belong to the same row share one driving electrode COML in common. The plurality of driving electrodes COML respectively extend in the X axis direction and are aligned in the Y axis direction in the display region Ad. As described above, since the plurality of scanning lines GCL respectively extend in the X axis direction and are aligned in the Y axis direction in the display region Ad, the direction each of the plurality of driving electrodes COML extends is parallel to the direction each of the plurality of scanning lines GCL extends. However, the direction each of the plurality of driving electrodes COML extends is not limited, and the direction each of the plurality of driving electrodes COML extends might, for instance, be a direction which is parallel to the direction each of the plurality of signal lines SGL extends.

The gate driver 12 as shown in FIG. 1 sequentially selects one row, namely one horizontal line, from among the sub-pixels SPix which are formed in a matrix-like form in the liquid crystal display device 20, as an object of display driving by applying scanning signals Vscan to the gate electrodes of the TFT elements Tr of each of the sub-pixels SPix by means of the scanning lines GCL shown in FIG. 7. The source driver 13 shown in FIG. 1 supplies pixel signals Vpix to each of the plurality of sub-pixels SPix which makes up one horizontal line sequentially selected by the gate driver 12 by means of the signal lines SGL shown in FIG. 7. Then, displays in accordance with supplied pixel signals Vpix are made at the plurality of sub-pixels SPix which makes up one horizontal line.

The driving electrode driver 14 shown in FIG. 1 applies driving signals Vcom to drive the driving electrodes COML for each detection block corresponding to one or a plurality of driving electrodes COML.

In the liquid crystal display device 20, sub-pixels SPix are sequentially selected in each horizontal line by driving the gate driver 12 to perform sequential scanning of the scanning lines GCL on a time division basis. In the liquid crystal display device 20, the source driver 13 supplies pixel signals Vpix to the sub-pixels SPix which belong to one horizontal line, so that displays are made in each horizontal line. In performing these display operations, the driving electrode driver 14 applies driving signals Vcom to a detection block including the driving electrodes COML corresponding to the horizontal line.

Figure 8:
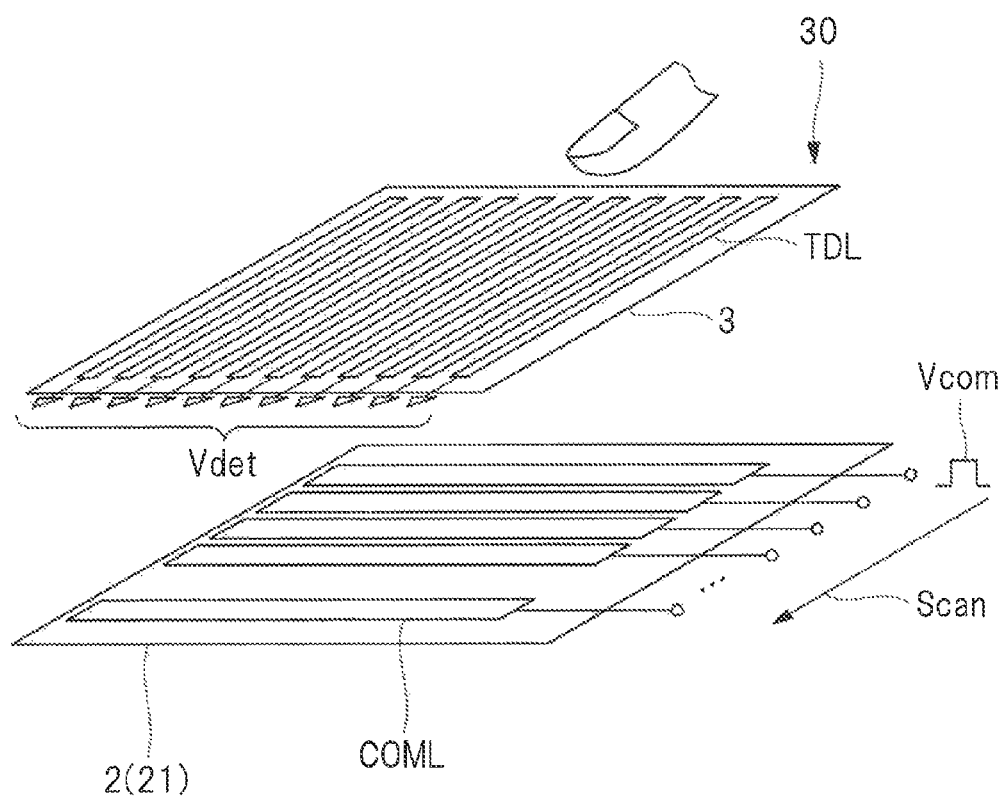
FIG. 8 A perspective view showing one configuration example of driving electrodes and detecting electrodes of the display according to the first embodiment.

The driving electrodes COML of the display 1 according to the first embodiment operate as driving electrodes of the liquid crystal display device 20 and also operate as driving electrodes of the touch detection device 30. FIG. 8 is a perspective view showing one configuration example of the driving electrodes and the detecting electrodes of the display according to the first embodiment.

The touch detection device 30 includes a plurality of driving electrodes COML which are provided on the array substrate 2 and a plurality of detecting electrodes TDL which are provided on the opposing substrate 3. Each of the plurality of detecting electrodes TDL extends in the direction which intersects with the direction each of the plurality of driving electrodes COML extends when seen in a plan view. In other words, each of the plurality of detecting electrodes TDL is provided to intersect with each of the plurality of driving electrodes COML at intervals with each other when seen in a plan view. Further, each of the plurality of detecting electrodes TDL opposes the driving electrodes COML in a direction perpendicular to the surface of the transparent substrate 21 included in the array substrate 2. Each of the plurality of detecting electrodes TDL is respectively connected with the touch detecting signal amplification unit 42 (see FIG. 1) of the touch detection unit 40. Electrostatic capacities are generated at intersecting portions of each of the plurality of driving electrodes COML and each of the plurality of detecting electrodes TDL when seen in a plan view. Input positions are detected based on the electrostatic capacities between each of the plurality of driving electrodes COML and each of the plurality of detecting electrodes TDL. Namely, a detection unit which detects input positions, that is, an input device is formed by the electrode substrate such as the transparent substrate 31 formed with the detecting electrodes TDL (see FIG. 6) and the driving electrodes COML.

With such an arrangement, when performing touch detection operations in the touch detection device 30, the driver electrode driver 14 sequentially selects one detection block corresponding to one or a plurality of driving electrodes COML in a scanning direction Scan. Then, in the selected detection block, the driver electrodes COML are input with driving signals Vcom for measuring the electrostatic capacities between the driving electrodes COML and the detecting electrodes TDL, and detecting signals Vdet are output from the detecting electrodes TDL for detecting input positions. In this manner, the touch detection device 30 is arranged in that touch detection is performed for each detection block. That is, one detection block corresponds to the driving electrodes E1 of the above-described touch detection principle, and the detecting electrodes TDL correspond to the detecting electrodes E2.

In this respect, the range of the detection block at the time of display operations and the range of the detection block at the time of touch detection operations might be either the same or different.

As shown in FIG. 8, the plurality of driving electrodes COML and the plurality of detecting electrodes TDL which intersect with each other when seen in a plan view form an electrostatic capacity type touch sensor aligned in a matrix-like form. Thus, by scanning the entire touch detection surface of the touch detection device 30, it is possible to detect a position contacted or approached by a finger.

As shown in FIG. 6, the opposing substrate 3 includes the transparent substrate 31, a color filter 32, the detecting electrodes TDL and a protection film 33. The transparent substrate 31 includes an upper surface as a main surface and a lower surface as a main surface on the opposite side of the upper surface. The color filter 32 is formed on the lower surface of the transparent substrate 31 as one main surface thereof. The detecting electrodes TDL are detecting electrodes of the touch detection device 30 and are formed on the upper surface of the transparent substrate 31 as the other main surface thereof. The protection film 33 is provided on the upper surface of the transparent substrate 31 to cover the plurality of detecting electrodes TDL.

For instance, a color filter colored in three colors of red (R), green (G) and blue (B) is aligned in the X axis direction as the color filter 32. With this arrangement, as shown in FIG. 7, a plurality of sub-pixels SPix corresponding to each of color regions 32R, 32G and 32B of the three colors of R, G and B are formed, and one pixel Pix is formed by the plurality of sub-pixels SPix corresponding to each of a single group of the color regions 32R, 32G and 32B. The pixels Pix are aligned in a matrix-like form along the direction the scanning lines GCL extend (X axis direction) and the direction the signal lines SGL extend (Y axis direction). The region in which the pixels Pix are aligned in a matrix-like form is, for instance, the above-described display region Ad. In this respect, it is also possible that a dummy region provided with dummy pixels is provided in the periphery of the display region Ad.

The combination of colors of the color filter 32 might be another combination of a plurality of colors including colors other than R, G and B. It is also possible to provide no color filter 32 at all. Alternatively, one pixel Pix might include a sub-pixel SPix which is not provided with the color filter 32, that is, a white-colored sub-pixel SPix. It is also possible that the color filter layer is provided on the substrate 2 through COA (color filter on array) technology.

In this respect, as shown in FIG. 6, it is also possible to provide a polarizing plate 25 on the opposite side of the opposing substrate 3 with the array substrate 2 being interposed therebetween. Further, it is also possible to provide a polarizing plate 34 on the opposite side of the of array substrate 2 with the opposing substrate 3 being interposed therebetween.

<Shape and Arrangement of Detecting Electrodes>

Figure 9:
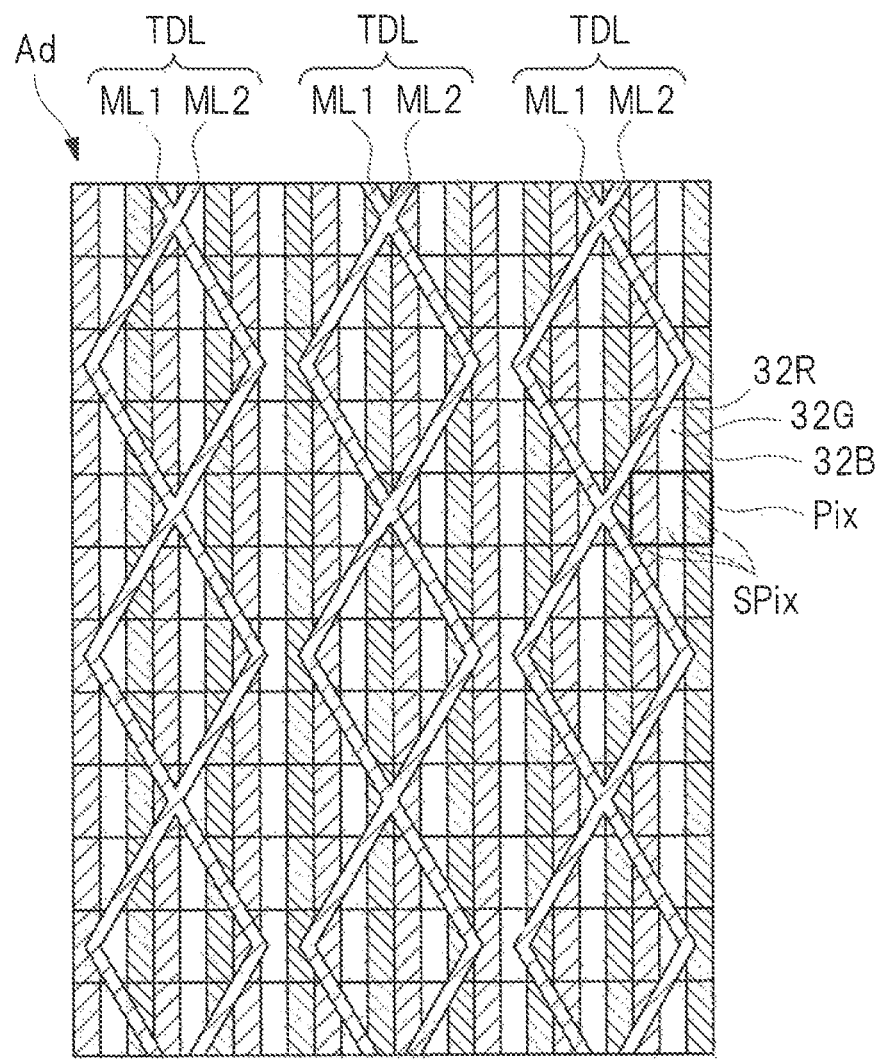
FIG. 9 A plan view schematically showing one example of a relationship between positions of detecting electrodes and positions of pixels in the display according to the first embodiment.
Figure 10:
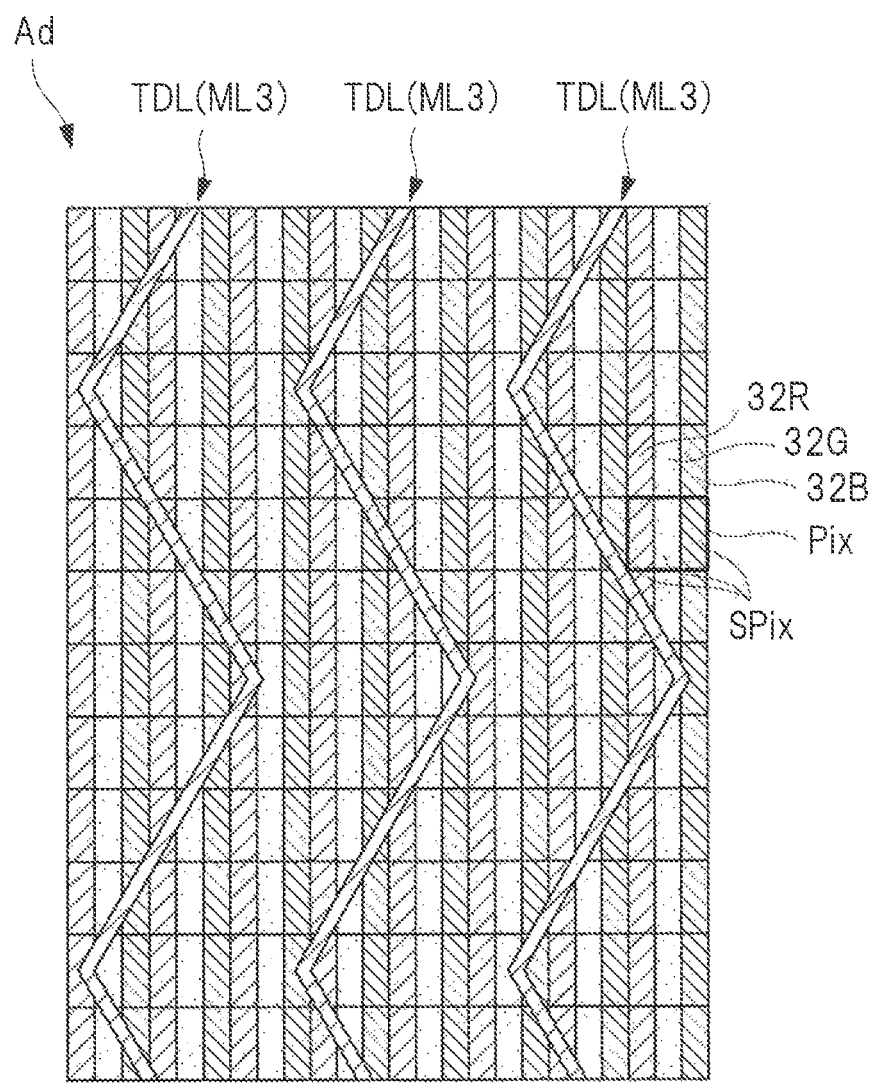
FIG. 10 A plan view schematically showing one example of a relationship between positions of detecting electrodes and positions of pixels in the display according to the first embodiment.

Next, shapes and arrangements of the detecting electrodes will be explained with reference to FIG. 9 and FIG. 10. FIG. 9 and FIG. 10 are plan views schematically showing examples of a relationship between positions of detecting electrodes and positions of pixels in the display according to the first embodiment.

As shown in FIG. 9 and FIG. 10, the plurality of pixels Pix are aligned in a matrix-like form in the X axis direction and the Y axis direction within the display region Ad. Each of the plurality of pixels Pix includes a plurality of sub-pixels SPix aligned in the X axis direction. Accordingly, the plurality of pixels Pix are aligned in a matrix-like form in the X axis direction and the Y axis direction within the display region Ad. In the examples shown in FIG. 9 and FIG. 10, the pixels Pix include three types of sub-pixel SPix displaying each of the three colors of R (red), G (green) and B (blue). Accordingly, the pixels Pix include a plurality of sub-pixels SPix respectively corresponding to each of the color regions 32R, 32G and 32B of the three colors of R, G and B. In this respect, the types of colors displayed by the sub-pixels SPix are not limited to three types. For instance, the pixels Pix might include four types of sub-pixels SPix displaying each of the four colors of R (red), G (green), B (blue) and W (white).

As shown in FIG. 9, each of the plurality of detecting electrodes TDL aligned in the X axis direction might also have a mesh-like form when seen in a plan view formed by a plurality of conductive lines. In the example shown in FIG. 9, each of the plurality of detecting electrodes TDL includes a conductive line ML1 and a conductive line ML2. Each of the conductive lines ML1 and the conductive lines ML2 has a zigzag form extending in the Y axis direction as a whole while alternately bending in opposite directions when seen in a plan view. Conductive lines ML1 and conductive lines ML2 which adjoin in the X axis direction are connected at portions bending in mutually opposite directions. In this respect, it is also possible that each of the plurality of detecting electrodes TDL includes a plurality of conductive lines ML1 and a plurality of conductive lines ML2.

As shown in FIG. 10, each of the plurality of detecting electrodes TDL aligned in the X axis direction might also have a zigzag form extending in the Y axis direction as a whole while alternately bending in opposite directions when seen in a plan view. In the example shown in FIG. 10, each of the plurality of detecting electrodes TDL includes a conductive line ML3. In this respect, each of the plurality of detecting electrodes TDL might also include a plurality of conductive lines ML3, and of each of the plurality of conductive lines ML3 included in one detecting electrode TDL, end portions on one side in the Y axis direction or end portions on the other side might be electrically connected with each other.

<Time Constant>

Figure 11:
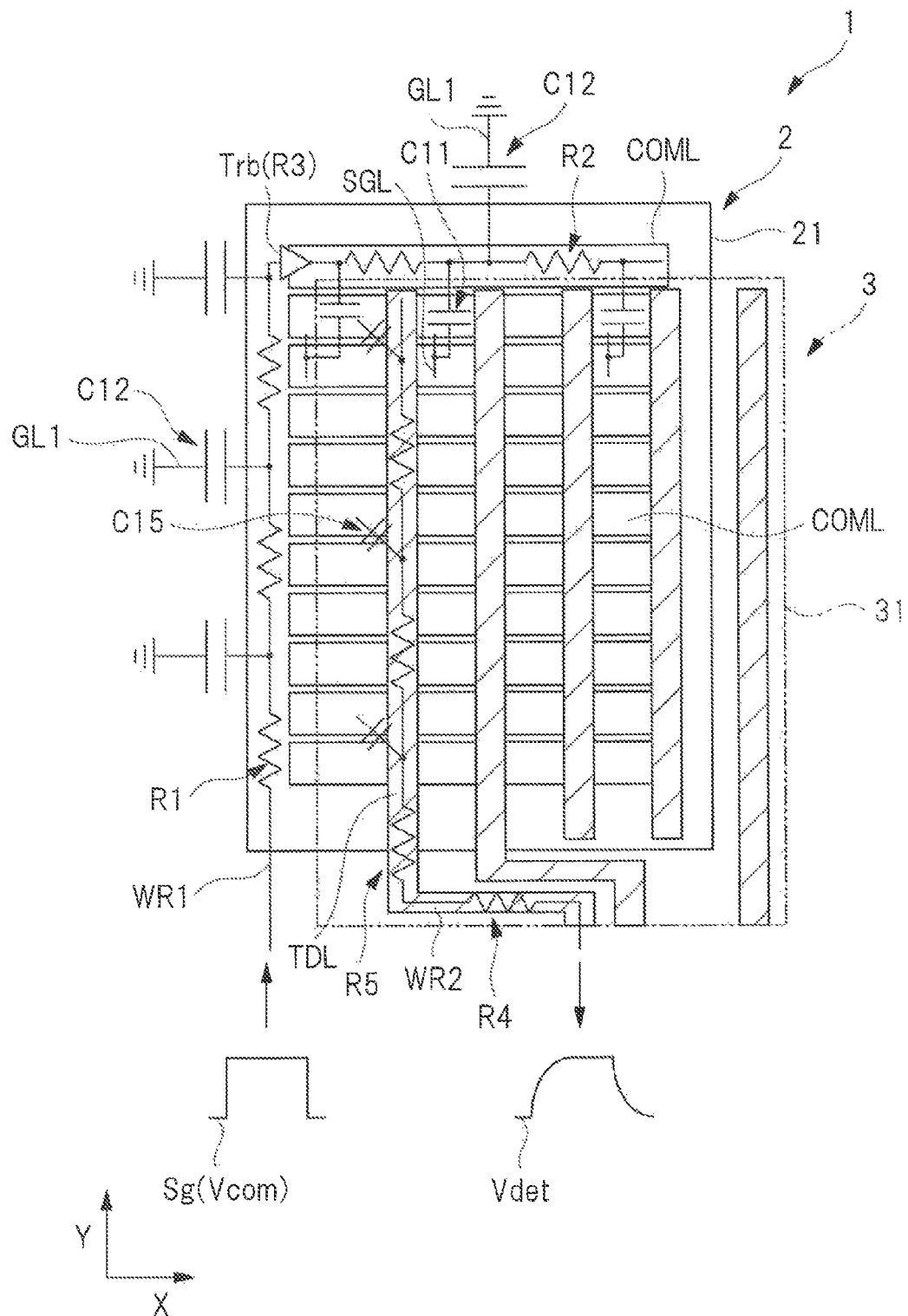
FIG. 11 A diagram for explaining resistance components and electrostatic capacity components which determine time constants.

Referring to FIG. 4 and FIG. 11, time constants of electric circuits including driving electrodes and detecting electrodes will now be explained. FIG. 11 is a diagram for explaining resistance components and electrostatic capacity components which determine time constants. In FIG. 11, the opposing substrate 3 which is originally arranged to overlap the array substrate 2 when seen in a plan view is illustrated to be shifted from the array substrate 2 when seen in a plan view for ease of understanding.

When the electric circuit which includes driving electrodes COML and detecting electrodes TDL and which detects electrostatic capacities is a circuit composed of resistance and electrostatic capacity, namely, when it is a so-called RC circuit, the time constant τ of the entire electric circuit is given by the following equation (1)

$$\tau = RC \qquad (1)$$

Here, R is the resistance of the entire electric circuit and C is the electrostatic capacity of the entire electric circuit.

Due to such a time constant τ, delays are caused in the rise time of the detecting signals Vdet when compared to changes in the alternating rectangular waves Sg as shown, for instance, in FIG. 4. Then, when rising of the waveforms starts at time t=0, the detecting signals Vdet rise to 0.63 times the rising height after sufficient elapse of time at time t=τ which is equal to the time constant τ. At time t=3τ which is three times the time constant τ, the detecting signals Vdet rise to 0.95 times the rising height after sufficient elapse of time.

Resistance components and electrostatic capacity components which determine the electric circuits including the driving electrodes COML and the detecting electrodes TDL based on the above equation (1) are the following components.

First, the resistance component might be resistance R1 of routing wirings WR1, arranged at peripheral portions of the array substrate 2, which are wirings for inputting alternating rectangular waves Sg as driving signals Vcom to the driving electrodes COML. It might also be resistance R2 of the driving electrodes COML. Further, it might also be resistance R3, as ON resistance of buffer TFT elements Trb, which are provided between the driving electrodes COML and the routing wirings WR1 as a buffer as shown in FIG. 11, which is a resistance when the buffer TFT elements Trb are in an ON state. Moreover, it might be resistance R4 of routing wirings WR2, provided at peripheral portions of the opposing substrate 3, which are wirings for outputting detecting signals Vdet from the detecting electrodes TDL. Further, it might be resistance R5 of the detecting electrodes TDL.

On the other hand, the electrostatic capacity component might be electrostatic capacity C11 between the driving electrodes COML and the signal lines SGL. It might also be electrostatic capacity C12 between the driving electrodes COML and grounding lines GL1. In this respect, the electrostatic capacity C12 includes electrostatic capacity between the driving electrodes COML and the scanning lines GCL (see FIG. 7), electrostatic capacity between the routing wirings WR1 and the grounding lines GL1 and other kinds of electrostatic capacities. Further, it might be electrostatic capacity C13 (not shown) caused by TFT elements Tr in ON state from among the plurality of TFT elements Tr (see FIG. 7) provided to correspond to the plurality of sub-pixels SPix. Alternatively, it might be electrostatic capacity C14 (not shown) caused by TFT elements Tr in OFF state from among the plurality of TFT elements Tr. Further, it might be electrostatic capacity C15 between the driving electrodes COML and the detecting electrodes TDL.

<Cross-Sectional Structures of Detecting Electrodes>

Cross-sectional structures of detecting electrodes will now be explained with reference to FIG. 12 to FIG. 22. FIG. 12 to FIG. 22 are cross-cross-sectional views showing various examples of detecting electrodes in the display according to the first embodiment.

Figure 12:
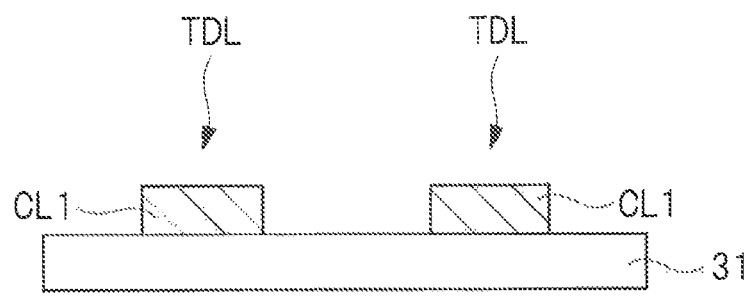
FIG. 12 A cross-sectional view showing various examples of detecting electrodes in the display according to the first embodiment.

In the example shown in FIG. 12, each of the plurality of detecting electrodes TDL includes a conductive layer CL1 provided on the main surface of the transparent substrate 31. The conductive layer CL1 is composed of a metallic material. The metallic material of the conductive layer CL1 might, for instance, be aluminum (Al), copper (Cu), a silver (Ag) alloy, chrome (Cr), molybdenum (Mo) or an aluminum alloy (for instance, AlNd, AlCu, AlSi or AlSiCu).

Figure 13:
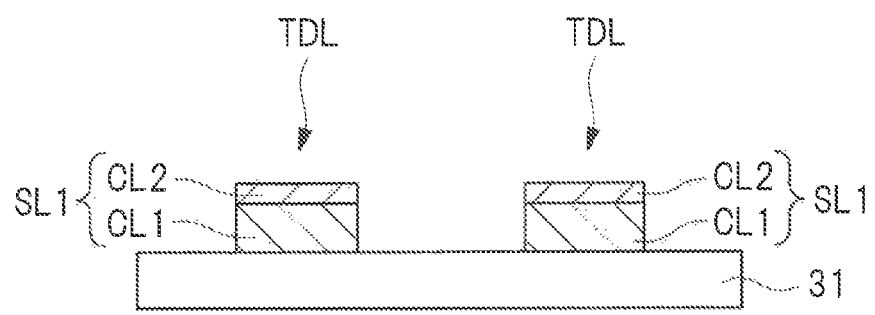
FIG. 13 A cross-sectional view showing various examples of detecting electrodes in the display according to the first embodiment.
Figure 14:
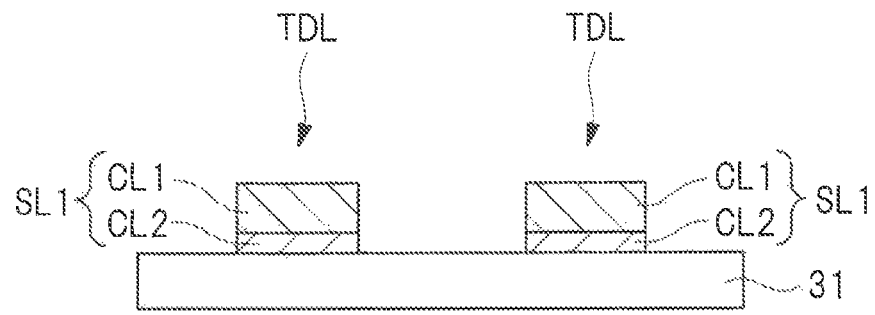
FIG. 14 A cross-sectional view showing various examples of detecting electrodes in the display according to the first embodiment.

In the example shown in FIG. 13 and FIG. 14, each of the plurality of detecting electrodes TDL includes a stacked film SL1 on the main surface of the transparent substrate 31 in which the conductive layer CL1 and the conductive layer CL2 are stacked in any order. The conductive layer CL1 might be the conductive layer CL1 in the example shown in FIG. 12. Further, the conductive layer CL2 might be a conductive layer CL2 composed of a metallic material having a melting point higher than the melting point of the metallic material of the conductive layer CL1. The metallic material of the conductive layer CL2 might, for instance, be molybdenum (Mo), titanium (Ti), titanium nitride (TiN), tantalum (Ta), tantalum nitride (TaN) or a molybdenum (Mo) alloy.

In the example shown in FIG. 13, the conductive layer CL2 is stacked on the conductive layer CL1. The conductive layer CL2 composed of a metallic material having a melting point higher than the melting point of the metallic material of the conductive layer CL1 has a Young's modulus higher than the Young's modulus of the conductive layer CL1. Accordingly, the surface of the conductive layer CL1 can be protected by the conductive layer CL2 having a high Young's modulus.

On the other hand, in the example shown in FIG. 14, the conductive layer CL1 is stacked on the conductive layer CL2. Since the conductive layer CL2 is composed of a metallic material having a melting point higher than the melting point of the metallic material of the conductive layer CL1, adhesion between the conductive layer CL2 and the transparent substrate 31 when the conductive layer CL2 is directly formed on the main surface of the transparent substrate 31 is larger than the adhesion between the conductive layer CL1 and the transparent substrate 31 when the conductive layer CL1 is directly formed on the main surface of the transparent substrate 31. Therefore, it is possible to improve the adhesion of the detecting electrodes TDL with respect to the transparent substrate 31 by interposing the conductive layer CL2 between the transparent substrate 31 and the conductive layer CL1.

Figure 15:
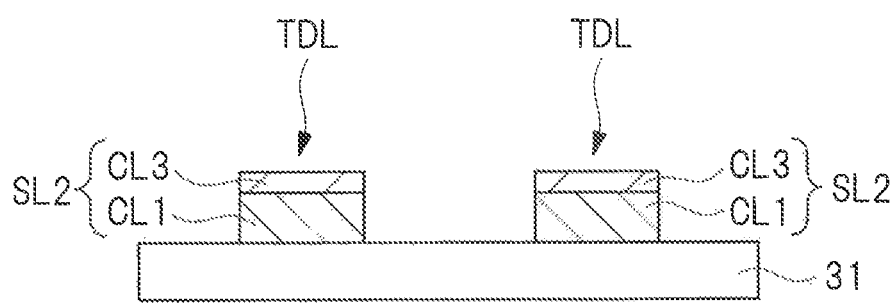
FIG. 15 A cross-sectional view showing various examples of detecting electrodes in the display according to the first embodiment.

In the example shown in FIG. 15, each of the plurality of detecting electrodes TDL includes a stacked film SL2 on the main surface of the transparent substrate 31 in which the conductive layer CL1 and a conductive layer CL3 are stacked in any order. The conductive layer CL1 might be the conductive layer CL1 in the example shown in FIG. 12. The conductive layer CL3 might be a conductive layer CL3 composed of a transparent conductive film. The transparent conductive film of the conductive layer CL3 might be a transparent conductive film composed of an inorganic transparent conductive material such as indium tin oxide (ITO) or indium zinc oxide (IZO).

In this respect, in the present specification, the expression "transparent" of the transparent conductive film or the transparent conductive material indicates that the transmittance with respect to visible light is, for instance, not less than 80%. Further, the expression "conductive" of the conductive layer, the transparent conductive film and the transparent conductive material indicates that the specific resistance is, for instance, not more than $2 \times 10^{-3} \Omega \text{cm}$.

In the example shown in FIG. 15, the conductive layer CL3 is stacked on the conductive layer CL1. With this arrangement, it is possible to restrict reflection of light or glares caused by the conductive layer CL1 composed of a metallic material and to improve visibility of images displayed in the display region Ad (see FIG. 5). Further, when the conductive layer CL3 composed of a transparent conductive film such as an ITO film or an IZO film has a Young's modulus higher than the Young's modulus of the conductive layer CL1, it is possible to protect the surface of the conductive layer CL1 by the conductive layer CL3 having a high Young's modulus.

In this respect, it is also possible that the conductive layer CL1 is stacked on the conductive layer CL3. When the adhesion between the conductive layer CL3 and the transparent substrate 31 is larger than the adhesion between the conductive layer CL1 and the transparent substrate 31, it is possible to improve the adhesion of the detecting electrodes TDL with respect to the transparent substrate 31 by interposing the conductive layer CL3 between the transparent substrate 31 and the conductive layer CL1.

Figure 16:
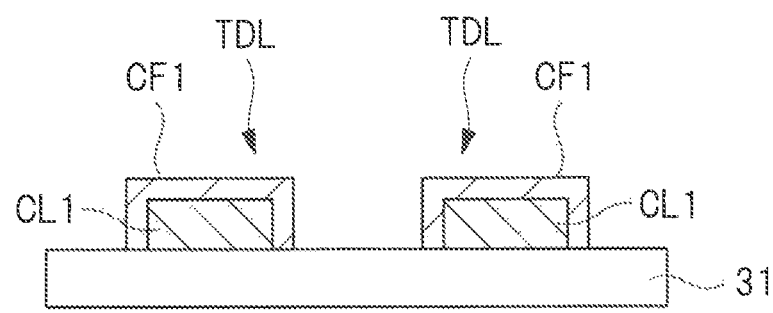
FIG. 16 A cross-sectional view showing various examples of detecting electrodes in the display according to the first embodiment.

In the example shown in FIG. 16, each of the plurality of detecting electrodes TDL includes the conductive layer CL1 provided on the main surface of the transparent substrate 31 and a conductive film CF1 provided to cover the conductive layer CL1. The conductive layer CL1 might be the conductive layer CL1 in the example shown in FIG. 12. The conductive film CF1 might be a conductive film CF1 composed of a transparent conductive film. The transparent conductive film of the conductive film CF1 might be a transparent conductive film composed of an inorganic transparent conductive material such as ITO or IZO.

With this arrangement, it is possible to restrict reflection of light or glares caused by the conductive layer CL1 composed of a metallic material and to improve visibility of images displayed in the display region Ad (see FIG. 5). Further, when the conductive film CF1 composed of a transparent conductive film such as an ITO film or an IZO film has a hardness higher than the Young's modulus of the conductive layer CL1, it is possible to protect the surface of the conductive layer CL1 by the conductive film CF1 having a high Young's modulus.

Figure 17:
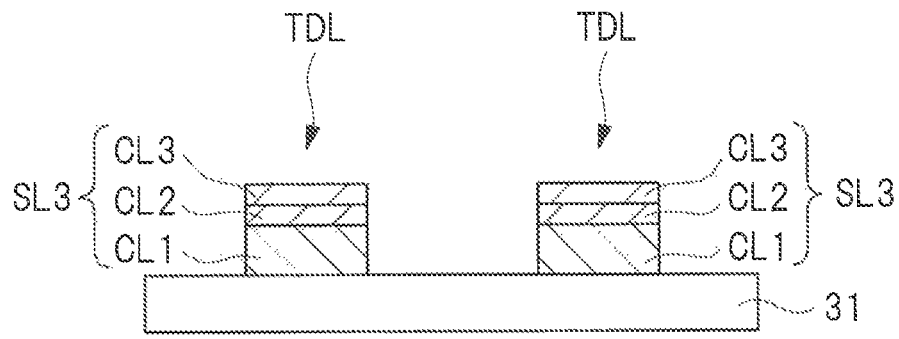
FIG. 17 A cross-sectional view showing various examples of detecting electrodes in the display according to the first embodiment.
Figure 18:
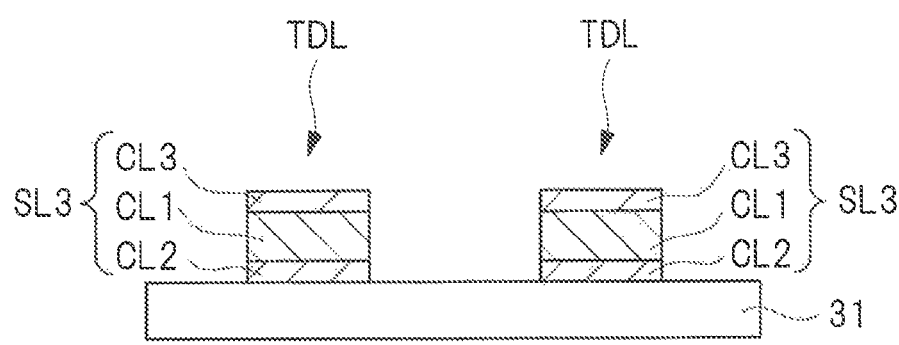
FIG. 18 A cross-sectional view showing various examples of detecting electrodes in the display according to the first embodiment.

In the example shown in FIG. 17 and FIG. 18, each of the plurality of detecting electrodes TDL includes a stacked film SL3 on the main surface of the transparent substrate 31 in which the conductive layer CL1, the conductive layer CL2 and the conductive layer CL3 are stacked in any order. Further, in the example shown in FIG. 19, each of the plurality of detecting electrodes TDL includes a stacked film SL3 in which the conductive layer CL4 is provided on the main surface of the transparent substrate 31, and in which the conductive layer CL1, the conductive layer CL2 and the conductive layer CL3 are stacked in any order on the conductive layer CL4. The conductive layer CL1 might be the conductive layer CL1 in the example shown in FIG. 12. The conductive layer CL2 might be the conductive layer CL2 in the example shown in FIG. 13 and FIG. 14. The conductive layer CL3 might be the conductive layer CL3 in the example shown in FIG. 15. The conductive layer CL4 might be a conductive layer CL4 composed of the same metallic material as the metallic material of the conductive layer CL2 in the example shown in FIG. 13 and FIG. 14.

Figure 19:
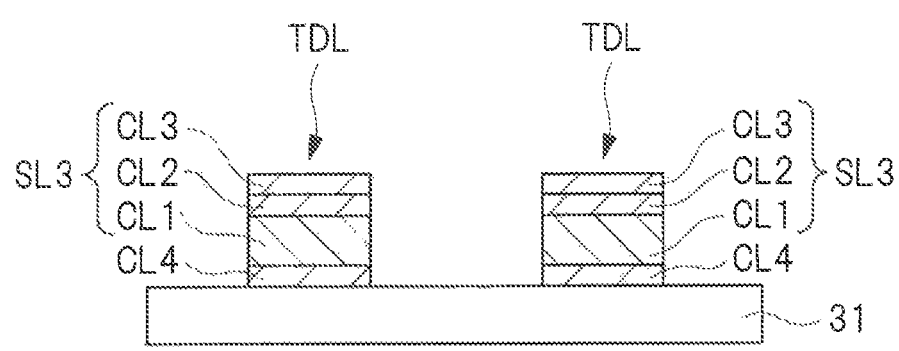
FIG. 19 A cross-sectional view showing various examples of detecting electrodes in the display according to the first embodiment.

In the example shown in FIG. 17 and FIG. 19, the stacked film SL3 is formed by stacking the conductive layer CL1, the conductive layer CL2 and the conductive layer CL3 in this order from the bottom to the top. In the example shown in FIG. 18, the stacked film SL3 is formed by stacking the conductive layer CL2, the conductive layer CL1 and the conductive layer CL3 in this order from the bottom to the top.

In the example shown in FIG. 17 to FIG. 19, by providing the conductive layer CL3 as the topmost layer of the stacked film SL3, it is possible to restrict reflection of light or glares caused by the conductive layer CL1 or the conductive layer CL2 composed of a metallic material and to improve visibility of images displayed in the display region Ad (see FIG. 5). Further, in the example shown in FIG. 18, when the conductive layer CL3 composed of a transparent conductive film such as an ITO film or an IZO film has a Young's modulus higher than the Young's modulus of the conductive layer CL1, it is possible to protect the surface of the conductive layer CL1 by the conductive layer CL3 having a high Young's modulus.

In the example shown in FIG. 17 and FIG. 19, it is possible to protect the surface of the conductive layer CL1 by the conductive layer CL2 having a Young's modulus higher than the Young's modulus of the conductive layer CL1. Further, in the example shown in FIG. 18 and FIG. 19, it is possible to improve the adhesion of the detecting electrodes TDL with respect to the transparent substrate 31 by interposing the conductive layer CL2 or the conductive layer CL4 between the transparent substrate 31 and the conductive layer CL1.

Figure 20:
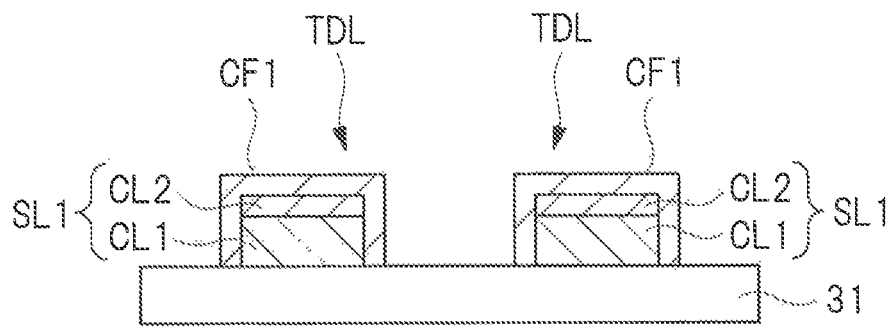
FIG. 20 A cross-sectional view showing various examples of detecting electrodes in the display according to the first embodiment.
Figure 21:
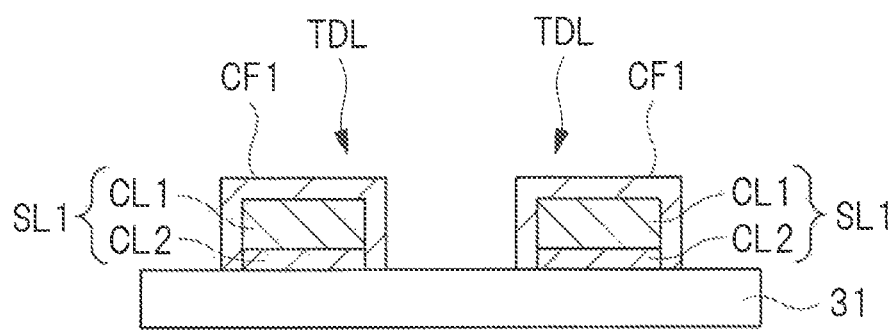
FIG. 21 A cross-sectional view showing various examples of detecting electrodes in the display according to the first embodiment.

In the example shown in FIG. 20 and FIG. 21, each of the plurality of detecting electrodes TDL includes the stacked film SL1 in which the conductive layer CL1 and the conductive layer CL2 are stacked in any order on the main surface of the transparent substrate 31, and the conductive film CF1 provided to cover the stacked film SL1. In the example shown in FIG. 22, each of the plurality of detecting electrodes TDL includes the conductive layer CL4 provided on the main surface of the transparent substrate 31, the stacked film SL1 in which the conductive layer CL1 and the conductive layer CL2 are stacked in any order on the conductive layer CL4, and the conductive film CF1 provided to cover the stacked film SL1 and the conductive layer CL4. The conductive layer CL1 might be the conductive layer CL1 in the example shown in FIG. 12. The conductive layer CL2 might be the conductive layer CL2 in the example shown in FIG. 13 and FIG. 14. The conductive film CF1 might be the conductive film CF1 in the example shown in FIG. 16. The conductive layer CL4 might be the conductive layer CL4 in the example shown in FIG. 19.

Figure 22:
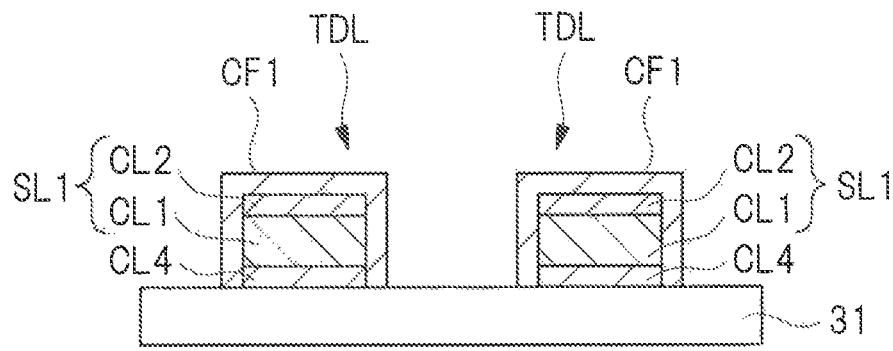
FIG. 22 A cross-sectional view showing various examples of detecting electrodes in the display according to the first embodiment.

In the example shown in FIG. 20 and FIG. 22, the stacked film SL1 is formed by stacking the conductive layer CL1 and the conductive layer CL2 in this order from the bottom to the top. In the example shown in FIG. 21, the stacked film SL1 is formed by stacking the conductive layer CL2 and the conductive layer CL1 in this order from the bottom to the top.

In the example shown in FIG. 20 to FIG. 22, since the stacked film SL1 is covered by the conductive film CL1 composed of a transparent conductive film, it is possible to restrict reflection of light or glares caused by the conductive layer CL1 or the conductive layer CL2 composed of a metallic material and to improve visibility of images displayed in the display region Ad (see FIG. 5). Further, in the example shown in FIG. 21, when the conductive film CL1 composed of a transparent conductive film such as an ITO film or an IZO film has a hardness higher than the Young's modulus of the conductive layer CL1, it is possible to protect the surface of the conductive layer CL1 by the conductive film CL1 having a high Young's modulus.

In the example shown in FIG. 20 and FIG. 22, it is possible to protect the surface of the conductive layer CL1 by the conductive layer CL2 having a Young's modulus higher than the Young's modulus of the conductive layer CL1. Further, in the example shown in FIG. 21 and FIG. 22, it is possible to improve the adhesion of the detecting electrodes TDL with respect to the transparent substrate 31 by interposing the conductive layer CL2 or the conductive layer CL4 between the transparent substrate 31 and the conductive layer CL1.

In this respect, in any of the examples shown in FIG. 12 to FIG. 22, the specific resistance ρ of the detecting electrodes TDL is not more than 40 μΩcm, and the detecting electrodes TDL have a temperature coefficient of resistance of $1 \times 10^{-3}$ to $5 \times 10^{-3} K^{-1}$, as it will be described using, for instance, Table 3 and FIG. 23 to be described later.

<Specific Resistances and Temperature Coefficients of Resistances of Materials of Detecting Electrodes>

Next, specific resistances and temperature coefficients of resistance of the detecting electrodes will be explained. Specific resistances ρ and temperature coefficients of resistance α of various materials used as materials of the detecting electrodes TDL in Examples and Comparative Examples to be described later are shown in Table 1.

TABLE 1

| MATERIAL OF DETECTING ELECTRODE TDL | SPECIFIC RESISTANCE ρ (Ωcm) | TEMPERATURE COEFFICIENT OF RESISTANCE α ($K^{-1}$) |
|---|---|---|
| PEDOT | $1.5 \times 10^{-3}$ | $-6.0 \times 10^{-4}$ |
| IZO | $6.0 \times 10^{-4}$ | $5.0 \times 10^{-4}$ |
| ITO | $5.2 \times 10^{-4}$ | $4.0 \times 10^{-4}$ |
| Al | $3.0 \times 10^{-6}$ | $4.0 \times 10^{-3}$ |
| Cu | $2.0 \times 10^{-6}$ | $5.0 \times 10^{-3}$ |
| Ag ALLOY | $3.0 \times 10^{-6}$ | $4.0 \times 10^{-3}$ |
| AlNd ALLOY | $7.0 \times 10^{-6}$ | $4.0 \times 10^{-3}$ |
| STACKED ALLOY | $40 \times 10^{-6}$ | $1.0 \times 10^{-3}$ to $5 \times 10^{-3}$ |

In Table 1, specific resistances at room temperature are indicated as specific resistances ρ. Further, in Table 1, temperature coefficients of resistance within a temperature range of 243 to 343K are indicated as temperature coefficients of resistance α. In this respect, in the present specification, when referring to specific resistances without specifying temperatures, the specific resistances are those at room temperature. Further, when referring to temperature coefficients of resistance without specifying a temperature range, the temperature coefficients of resistance are within a temperature range of 243 to 293K (room temperature) to 343K (hereinafter, this temperature range is indicated as 243 to 343K).

Further, in Table 1, there are shown specific resistances ρ and temperature coefficients of resistance α of various materials such as PEDOT (poly (3,4-ethylenedioxythiophene) as an organic transparent conductive material and such as ITO and IZO as inorganic transparent conductive materials, as materials used in Comparative Example 1 to Comparative Example 6 and Comparative Example 8 to Comparative Example 13 to be described later. Further, in Table 1, there are shown specific resistances ρ and temperature coefficients of resistance α of various metallic materials such as aluminum (Al), copper (Cu), a silver (Ag) alloy, an aluminum neodymium (AlNd) alloy and a stacked alloy, as materials used in Example 1 to Example 20, Comparative Example 7 and Comparative Example 14 to be discussed later.

As shown in Table 1, the specific resistances ρ of the above various metallic materials are in a range of 1/1000 to 1/100 of the specific resistances ρ of any of the materials of PEDOT as an organic transparent conductive material and of ITO and IZO as inorganic transparent conductive materials, and are thus remarkably low. Namely, the specific resistances ρ of the metallic materials are lower by two to three digits than the specific resistances ρ of any of the materials of PEDOT, ITO and IZO.

Further, as shown in Table 1, all of the above various metallic materials as well as ITO and IZO as inorganic transparent conductive materials have a positive temperature coefficient of resistance α. Namely, temperature dependences of resistance of all of the above various metallic materials as well as ITO and IZO as inorganic transparent conductive materials are so-called metallic temperature dependences of resistance that specific resistances ρ rise in accordance with temperature increases. Further, as shown in Table 1, PEDOT as an organic transparent conductive material has a negative temperature coefficient of resistance α. Namely, the temperature dependence of resistance of PEDOT is a so-called semi-conductive temperature dependence of resistance that the specific resistance ρ decreases in accordance with temperature increases.

On the other hand, the largest resistance component from among the resistances R1 to R4 explained using the above-described FIG. 11 is the resistance R3 as the ON resistance of the buffer TFT elements Trb. Further, since a semiconductor layer composed of polycrystalline silicone film is a part of the buffer TFT elements Trb which generates the resistance R3, the resistance R3 has a negative temperature coefficient of resistance α. Accordingly, when the detecting electrodes TDL are composed of the above various metallic materials, and of either ITO or IZO as an inorganic transparent conductive material, the resistance R5 of the detecting electrodes TDL has a temperature coefficient of resistance α of polarity opposite to the polarity of the temperature coefficient of resistance α of the resistance R3. Further, when the detecting electrodes TDL are composed of PEDOT as an organic transparent conductive material, the resistance R5 of the detecting electrodes TDL has a temperature coefficient of resistance α of the same polarity as the polarity of the temperature coefficient of resistance α of the resistance R3.

In this respect, the temperature coefficient of resistance α of the resistance R3 is, for instance, $-1.5 \times 10^{-3}$ ($K^{-1}$). Accordingly, absolute values of the temperature coefficients of resistance α of the above various metallic materials are of the same order as the absolute values of the temperature coefficients of resistance of the resistance R3 which has a temperature coefficient of resistance α of polarity opposite to the polarity of the temperature coefficients of resistance α of the above various metallic materials.

<Resistances of Detecting Electrodes of Mesh-like Form>

Next, estimations of resistances R5 of the detecting electrodes TDL having a mesh-like form as shown in FIG. 9 and composed of the various materials of Table 1 were performed.

The resistance R5 of the detecting electrodes TDL was defined to be a sum of all resistances of a plurality of detecting electrodes TDL. Further, an area ratio which is a ratio of a sum of areas of the plurality of detecting electrodes TDL with respect to an area of the entire display region Ad was defined to be an area ratio rs. Further, a sheet resistance of the detecting electrodes TDL when the detecting electrodes TDL are provided on the entire display region Ad was defined to be sheet resistance Rsh. Here, when a film thickness of the detecting electrodes TDL is defined to be film thickness d, the sheet resistance Rsh is given by the following equation (2) by using a specific resistance ρ of a material of the detecting electrodes TDL:

$$Rsh = \rho/d \quad (2)$$

The resistance R5 of the detecting electrodes TDL is given by the following equation (3):

$$R5 = Rsh/rs \quad (3)$$

Then, estimations of resistances R5 of the detecting electrodes TDL were performed using the above equation (2) and equation (3). The results are shown in Table 2.

TABLE 2

|  | MATERIAL OF DETECTING ELECTRODE TDL | RESISTANCE R5 OF DETECTING ELECTRODE TDL ($\Omega$) |
|---|---|---|
| COMPARATIVE EXAMPLE 1 | PEDOT | $29.7 \times 10^3$ |
| COMPARATIVE EXAMPLE 2 | IZO | $22.3 \times 10^3$ |
| COMPARATIVE EXAMPLE 3 | ITO | $19.3 \times 10^3$ |
| EXAMPLE 1 | Al | $6.38 \times 10^2$ |
| EXAMPLE 2 | Cu | $4.25 \times 10^2$ |
| EXAMPLE 3 | Ag ALLOY | $6.38 \times 10^2$ |
| EXAMPLE 4 | AlNd ALLOY | $1.48 \times 10^3$ |
| EXAMPLE 5 | STACKED ALLOY | $8.49 \times 10^3$ |

As shown in Table 2, cases in which various materials of PEDOT as an organic transparent conductive material and ITO and IZO as inorganic transparent conductive materials are used as materials of the detecting electrodes TDL are defined as Comparative Example 1 to Comparative Example 3. Further, cases in which detecting electrodes TDL having a mesh-like form as shown in FIG. 9 are provided by using various metallic materials of Al, Cu, an Ag alloy, an AlNd alloy and a stacked alloy as materials of the detecting electrodes TDL are defined as Example 1 to Example 5. At this time, the area ratios rs of Example 1 to Example 5 were 5%. Further, detecting electrodes TDL composed of a stacked alloy, of Example 5 correspond to the detecting electrodes TDL of a structure explained, for instance, using FIG. 13 and FIG. 14.

The film thicknesses d of Example 1 to Example 5 were defined to be substantially equal to the film thicknesses d of the Comparative Example 1 to Comparative Example 3.

As shown in Table 2, the resistances R5 of the detecting electrodes TDL of Example 1 to Example 5 can be made smaller than when compared to the resistances R5 of the detecting electrodes TDL of Comparative Example 1 to Comparative Example 3.

In this respect, in Comparative Example 1 to Comparative Example 3, since the detecting electrodes TDL are composed of a transparent conductive film and can be arranged to overlap the sub-pixels SPix when seen in a plan view, the area ratios rs of Comparative Example 1 to Comparative Example 3 are defined to be larger values when compared to the area ratios rs of Example 1 to Example 5. However, when the area ratios rs of Comparative Example 1 to Comparative Example 3 are defined to be values which are equal to the area ratios rs of Example 1 to Example 5, the resistances R5 of Comparative Example 1 to Comparative Example 3 are far larger than the resistances R5 of Comparative Example 1 to Comparative Example 3 as shown in Table 2. Accordingly, the fact that the area ratios rs of Comparative Example 1 to Comparative Example 3 are defined to be larger values when compared to the area ratios rs of Example 1 to Example 5 does not affect size relations of resistances R5 among Example 1 to Example 5 and Comparative Example 1 to Comparative Example 3.

<Time Constants of Detecting Electrodes of Mesh-like Form>

Next, results of estimating time constants when the detecting electrodes TDL have a mesh-like form as shown in FIG. 9 will be explained with reference to Table 3 and FIG. 23 to FIG. 28.

Here, estimations of time constants of electric circuits including driving electrodes COML and detecting electrodes TDL and of temperature variation ratios of time constants were performed based on equation (1), resistances R1 to R5 and electrostatic capacities C11 to C15. At this time, resistances R1 to R4 and electrostatic capacities C11 to C14 from among resistances R1 to R5 and electrostatic capacities C11 to C15 were made constant. Then, estimations of time constants when only the resistance values and the temperature variation ratios of resistances R5 were changed by changing the materials of the detecting electrodes TDL were performed. The results are shown in Table 3. In Table 3, time $3\tau$ which is three times the time constant $\tau$ is shown as the time constant. As it has been explained using FIG. 4 and FIG. 11, at time $3\tau$, the detecting signals Vdet rise to 0.95 times the entire rising height of waveforms after sufficient elapse of time. In this respect, Table 3 shows the time constant $3\tau$ in an optional unit standardized at a certain value. Further, Table 3 shows variation ratios within a temperature range of 243 to 343K as temperature variation ratios of the time constant $3\tau$.

TABLE 3

|  | MATERIAL OF DETECTING ELECTRODE TDL | TIME CONSTANT $3\tau$ (a.u.) | TEMPERATURE VARIATION RATIO OF TIME CONSTANT $3\tau$ (%) |
|---|---|---|---|
| COMPARATIVE EXAMPLE 4 | PEDOT | 4.11 | −5.23 |
| COMPARATIVE EXAMPLE 5 | IZO | 3.57 | −0.81 |
| COMPARATIVE EXAMPLE 6 | ITO | 3.35 | −0.27 |
| EXAMPLE 6 | Al | 2.16 | 1.77 |
| EXAMPLE 7 | Cu | 2.15 | 1.78 |
| EXAMPLE 8 | AlNd ALLOY | 2.20 | 0.96 |
| EXAMPLE 9 | STACKED ALLOY ($\rho$ = 40 $\mu\Omega$cm, $\alpha$ = 1 × 10$^{-3}$ K$^{-1}$) | 2.58 | 0.04 |
| EXAMPLE 10 | STACKED ALLOY ($\rho$ = 40 $\mu\Omega$cm, $\alpha$ = 5 × 10$^{-3}$ K$^{-1}$) | 2.58 | 4.94 |
| COMPARATIVE EXAMPLE 7 | STACKED ALLOY ($\rho$ = 40 $\mu\Omega$cm, $\alpha$ = 1 × 10$^{-2}$ K$^{-1}$) | 2.58 | 10.5 |

As shown in Table 3, cases in which various materials of PEDOT as an organic transparent conductive material and ITO and IZO as inorganic transparent conductive materials are used as materials of the detecting electrodes TDL are defined as Comparative Example 4 to Comparative Example 6. Further, cases in which detecting electrodes TDL having a mesh-like form as shown in FIG. 9 are provided by using various metallic materials of Al, Cu, and an AlNd alloy as materials of the detecting electrodes TDL are defined as Example 6 to Example 8. Further, from among stacked alloys having a specific resistance ρ of 40 μΩcm, a case in which a stacked alloy having a temperature coefficient of resistance α of $1\times10^{-3}K^{-1}$ is used is defined to be Example 9, a case in which a stacked alloy having a temperature coefficient of resistance α of $5\times10^{-3}K^{-1}$ is used is defined to be Example 10, and a case in which a stacked alloy having a temperature coefficient of resistance α of $1\times10^{-2}K^{-1}$ is used is defined to be Comparative Example 7.

Figure 23:
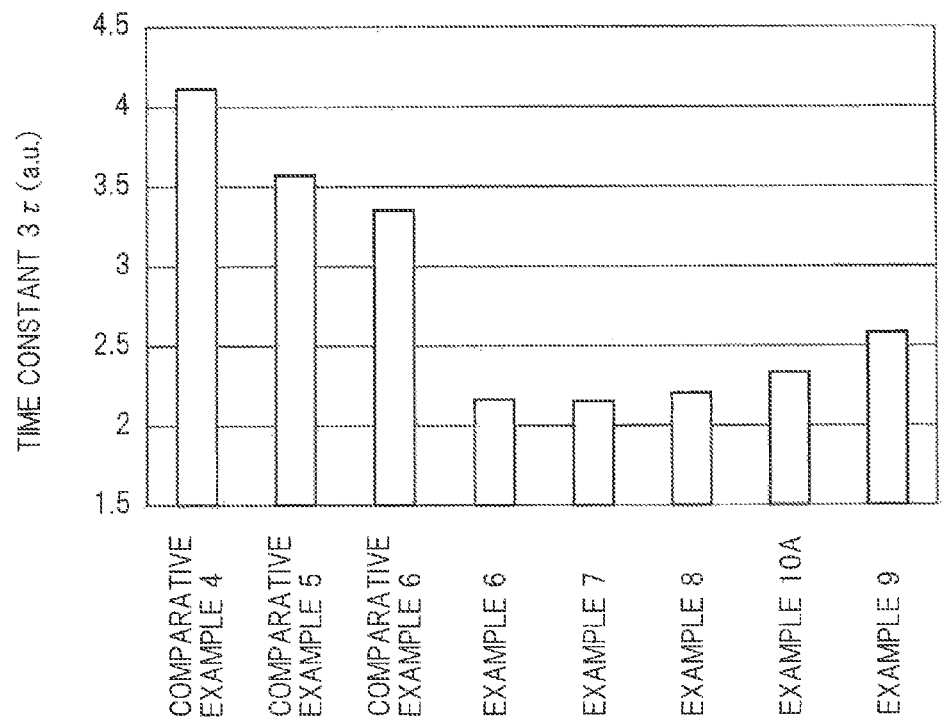
FIG. 23 A graph showing time constants of detecting electrodes composed of various metallic materials and having a mesh-like form.

FIG. 23 is a graph showing time constants of detecting electrodes composed of various metallic materials and having a mesh-like form. In FIG. 23, Comparative Example 4 to Comparative Example 6 and Example 6 to Example 9 from among Comparative Example 4 to Comparative Example 7 and Example 6 to Example 10 shown in Table 3 are shown. Further, in FIG. 23, a case in which a stacked alloy having a specific resistance ρ of 20 μΩcm is used is shown as Example 10A.

In this respect, in Comparative Example 4 to Comparative Example 6, Example 6 to Example 10 and Example 10A, estimations are performed supposing a display provided with a display region Ad of vertical type having a width across corner of 5 inches and having a FHD resolution with 1920 pixels aligned in the longitudinal direction (Y axis direction in FIG. 5) and 1080 pixels aligned in the transverse direction (X axis direction in FIG. 5).

As shown in FIG. 23 and Table 3, the time constant 3τ of Comparative Example 6 is the smallest (that is, 3.35) from among the time constants 3τ of Comparative Example 4 to Comparative Example 6, the time constants 3τ of Examples 6 to Example 10 and Example 10A are not more than 2.58 and thus reduced by not less than 20% when compared to Comparative Example 6 in which the time constant 3τ is 3.35.

In Example 6 to Example 10, the specific resistances ρ of the detecting electrodes TDL are not more than 40 μΩcm as shown in Table 1. Further, in Example 10A, the specific resistance ρ of the detecting electrodes TDL is 20 μΩcm and not more than 40 μΩcm as described above. Accordingly, when the specific resistances ρ of the detecting electrodes TDL are not more than 40 μΩcm, the time constant 3τ can be reduced by not less than 20% when compared to cases in which the detecting electrodes TDL are composed of a transparent conductive film. In this manner, since it is possible to increase the number of waveforms of the alternating rectangular waves Sg as the driving signals Vcom input to the driving electrodes COML within a predetermined period of time by reducing the time constant 3τ by not less than 20%, it is possible to easily improve the detection performance of the input device. On the other hand, when the specific resistances ρ of the detecting electrodes TDL exceed 40 μΩcm, it is impossible to reduce the time constant 3τ by not less than 20% when compared to cases in which the detecting electrodes TDL are composed of a transparent conductive film.

As shown in Table 3 and FIG. 23, the absolute values of the temperature variation ratios of the time constants 3τ of Example 9 and Example 10 are not more than 5%. On the other hand, the temperature variation ratio of the time constant 3τ of Comparative Example 7 is 10.5%, and the absolute value of the temperature variation ratio of the time constant 3τ exceeds 5%.

As shown in Table 1 and Table 3, the specific resistances ρ of the detecting electrodes TDL are not more than 40 μΩcm in Example 6 to Example 10, and the temperature coefficients of resistance are $1\times10^{-3}$ to $5\times10^{-3}K^{-1}$. Accordingly, when the specific resistances ρ of the detecting electrodes TDL are not more than 40 μΩcm and the temperature coefficients of resistance are $1\times10^{-3}$ to $5\times10^{-3}K^{-1}$, the absolute values of the temperature variation ratios of the time constants 3τ within a temperature range of 243 to 343K can be reduced to not more than 5%. In this manner, since it is possible to maintain the time constant so as to be substantially constant within a large temperature range by reducing the absolute values of the temperature variation ratios of the time constants 3τ within a temperature range of 243 to 343K to not more than 5%, it is possible to easily improve the detection performance of the input device. On the other hand, when the specific resistances ρ of the detecting electrodes TDL exceed 40 μΩcm or the temperature coefficients of resistance are not within the range of $1\times10^{-3}$ to $5\times10^{-3}K^{-1}$, it is impossible to reduce the absolute values of the temperature variation ratios of the time constants 3τ within a temperature range of 243 to 343K to not more than 5%.

Figure 24:
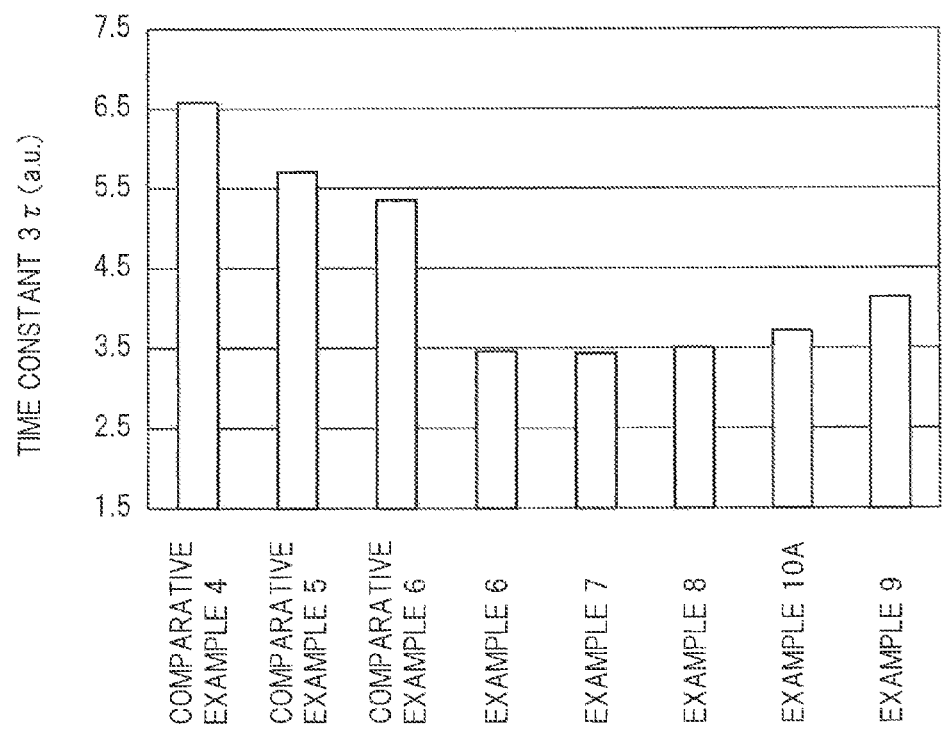
FIG. 24 A graph showing time constants of detecting electrodes composed of various metallic materials and having a mesh-like form in a case where the width across corner is 7 inches.

In this respect, estimations have been performed by supposing a display provided with a display region Ad of vertical type having a width across corner of 7 inches regarding time constants 3τ in a case in which detecting electrodes TDL composed of the various materials of Comparative Example 4 to Comparative Example 6, Example 6 to Example 9 and Example 10A are provided. More particularly, estimations have been performed by supposing a display provided with a display region Ad having of vertical type having a width across corner of 7 inches and having a WQXGA resolution with 2048 pixels aligned in the longitudinal direction (Y axis direction in FIGS. 5) and 1152 pixels aligned in the transverse direction (X axis direction in FIG. 5). The results are shown in FIG. 24. FIG. 24 is a graph showing time constants of detecting electrodes composed of various metallic materials and having a mesh-like form in a case where the width across corner is 7 inches.

As shown in FIG. 24, even in a case where the width across corner is 7 inches, when the specific resistances ρ of the detecting electrodes TDL are not more than 40 μΩcm, the time constants 3τ can be reduced by not less than 20% when compared to cases in which the detecting electrodes are composed of a transparent conductive film similarly to the case the width across corner is 5 inches. Further, as shown in FIG. 24, even in a case where the width across corner is 7 inches, when the specific resistances ρ of the detecting electrodes TDL are not more than 40 μΩcm and the temperature coefficients of resistance are $1\times10^{-3}$ to $5\times10^{-3}K^{-1}$, the absolute values of the temperature variation ratios of the time constants 3τ within a temperature range of 243 to 343K can be reduced to not more than 5% similarly to the case the width across corner is 5 inches.

Figure 25:
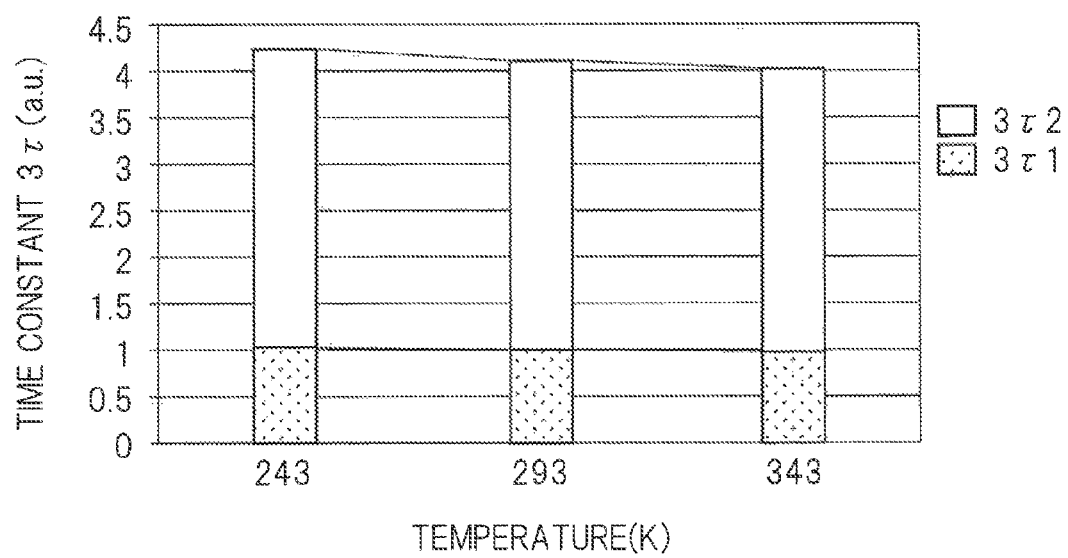
FIG. 25 A graph showing temperature dependency of the time constants in Comparative Example 4.
Figure 26:
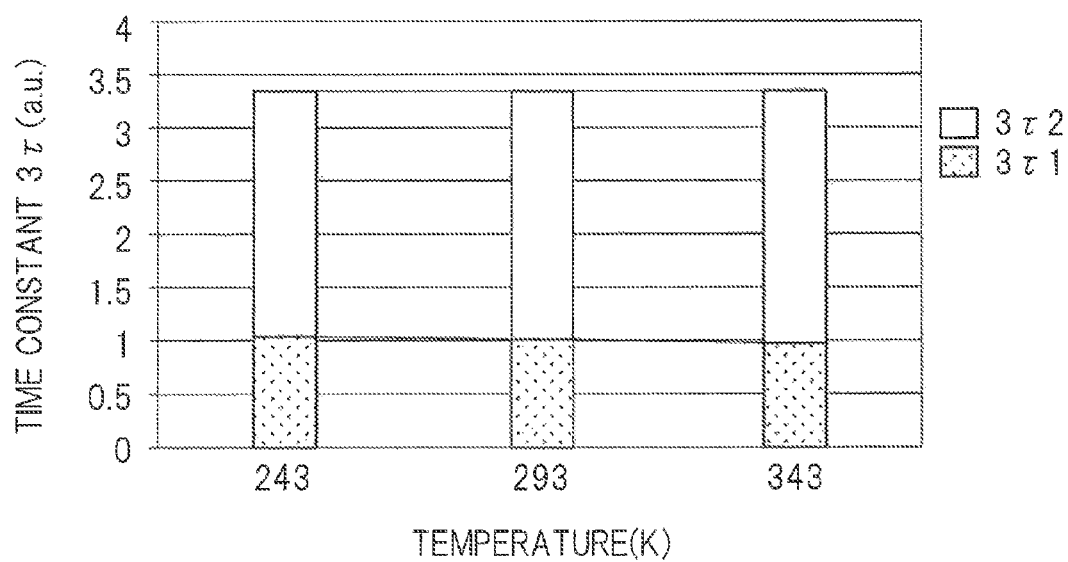
FIG. 26 A graph showing temperature dependency of the time constants in Comparative Example 6.
Figure 27:
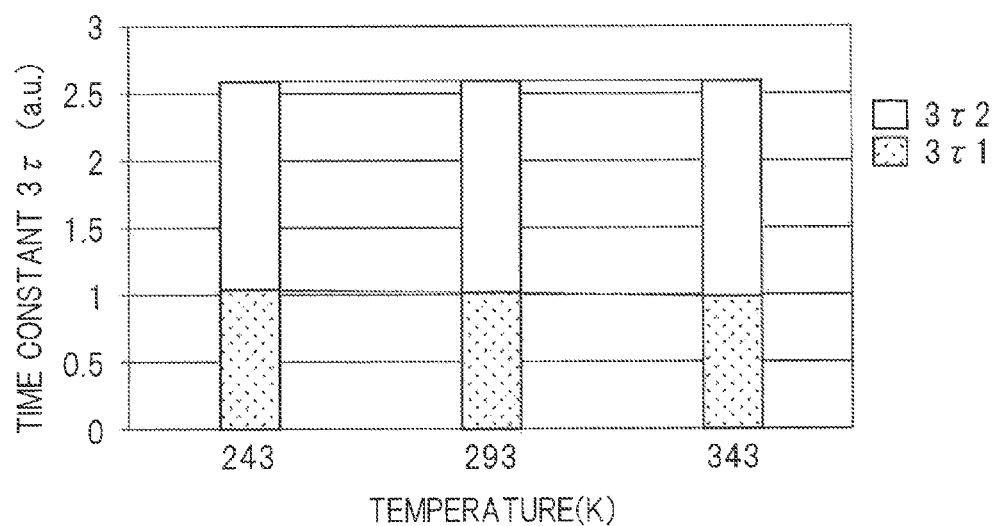
FIG. 27 A graph showing temperature dependency of the time constants in Example 9.

FIG. 25 is a graph showing temperature dependency of the time constants in Comparative Example 4. FIG. 26 is a graph showing temperature dependency of the time constants in Comparative Example 6. FIG. 27 is a graph showing temperature dependency of the time constants in Example 9. In FIG. 25 to FIG. 27, time constants at temperatures 243K, 293K and 343K are indicated separately as components 3τ1 caused by driving electrodes COML and as components 3τ2 caused by detecting electrodes TDL.

As shown in Table 3 and FIG. 25, the time constant 3τ of Comparative Example 4 at 293K (room temperature) is 4.11, and the temperature variation ratio of time constants 3τ within the temperature range of 243 to 343K is −5.23%. Further, as shown in Table 3 and FIG. 26, the time constant 3τ of Comparative Example 6 at 293K (room temperature) is 3.35, and the temperature variation ratio of time constants 3τ within the temperature range of 243 to 343K is −0.27%.

As shown in FIG. 25, in Comparative Example 4, since the components 3τ1 from among the time constants 3τ caused by the driving electrodes COML have a negative temperature variation ratio and the components 3τ2 from among the time constants 3τ caused by the detecting electrodes TDL have a negative temperature variation ratio, the entire time constants 3τ have a negative temperature variation ratio. Further, as shown in FIG. 26, in Comparative Example 6, since the components 3τ1 from among the time constants 3τ caused by the driving electrodes COML have a negative temperature variation ratio and the ratio of the component 3τ1 with respect to the entire time constant 3τ is large, the entire time constant 3τ has a negative temperature variation ratio.

On the other hand, as shown in Table 3 and FIG. 27, the time constant 3τ of Example 9 at 293K (room temperature) is 2.58, and the temperature variation ratio of time constants 3τ within the temperature range of 243 to 343K is 0.04%. In Example 9, since the components 3τ1 from among the time constants 3τ caused by the driving electrodes COML have a negative temperature variation ratio while the components 3τ2 from among the time constants 3τ caused by the detecting electrodes TDL have a positive temperature variation ratio, the absolute value of the entire time constant 3τ becomes small.

In the mutual capacity method in which input positions are detected by detecting electrostatic capacities between the driving electrodes COML and the detecting electrodes TDL, the detection performance of detecting electrostatic capacities can be improved the larger the number of waveforms of the alternating rectangular waves Sg (see FIG. 4) as the driving signals Vcom input to the driving electrodes COML within a predetermined period of time is. That is, the shorter periods of alternating rectangular waves Sg as the driving signals Vcom input to the driving electrodes COML are, the more can the detection performance of the input device be improved. Further, as explained above using FIG. 4, it is important to make the time constant τ of the electric circuit including the driving electrodes and the detecting electrodes small for improving the detection performance of the input device.

On the other hand, from among the resistances R1 to R5 and the electrostatic capacities C11 to C15 which are components affecting time constant τ as it has been explained using the above-described FIG. 11, electrostatic capacities C11 to C15 are substantially constant within a temperature range of, for instance, 243 to 343K. Further, from among resistances R1 to R5, resistances R1, R2 and R4 are smaller than when compared to resistance R3 and resistance R5. Accordingly, the temperature variation ratio of components 3τ1 from among the time constants 3τ caused by the driving electrodes COML is mainly dependent on the temperature variation ratio of the resistance R3 as the ON resistance of the buffer TFT elements Trb. Further, components 3τ2 from among the time constants 3τ caused by the detecting electrodes TDL are mainly dependent on the temperature variation ratio of the resistance R5 of the detecting electrodes TDL.

Figure 28:
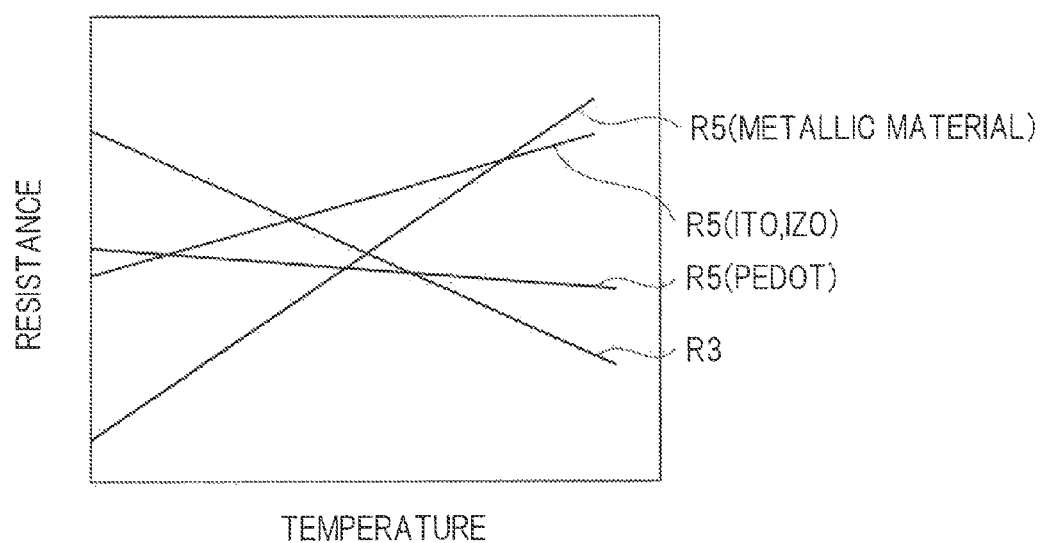
FIG. 28 A graph schematically showing temperature dependencies of the ON resistance of the buffer TFT elements, and of resistances of the detecting electrodes.

FIG. 28 is a graph schematically showing temperature dependencies of the ON resistance of the buffer TFT elements, and of resistances of the detecting electrodes.

As shown in FIG. 28, the resistance R3 as the ON resistance of buffer TFT elements Trb has a negative temperature coefficient of resistance and the resistance R3 reduces accompanying temperature increases. PEDOT as an organic transparent conductive material shown in Table 1 has a negative temperature coefficient of resistance. Therefore, when the detecting electrodes TDL are composed of PEDOT, the temperature variation ratio of the resistance R5 of the detecting electrodes TDL and the temperature variation ratio of the resistance R3 as the ON resistance of the buffer TFT elements Trb do not set each other off, and the absolute value of the temperature coefficient of resistance of the time constant 3τ cannot be made smaller than the absolute value of the temperature coefficient of resistance of the resistance R3.

On the other hand, ITO and IZO as inorganic transparent conductive materials as shown in Table 1 and the various metallic materials shown in Table 1 have a positive temperature coefficient of resistance. Therefore, when the detecting electrodes TDL are composed of ITO and IZO as inorganic transparent conductive materials as shown in Table 1 and of the various metallic materials shown in Table 1, the temperature variation ratio of the resistance R5 of the detecting electrodes TDL and the temperature variation ratio of the resistance R3 as the ON resistance of the buffer TFT elements Trb set each other off.

However, the temperature coefficients of resistance of ITO or IZO as inorganic transparent conductive materials are smaller than the temperature coefficients of resistance of the various metallic materials as shown in Table 1 by approximately one digit. Therefore, in a case where various metallic materials as shown in Table 1 are used as the materials of the detecting electrodes TDL, the absolute value of the temperature coefficient of resistance of the entire time constant 3τ can be reduced due to offsetting of the temperature variation ratio of the resistance R5 of the detecting electrodes TDL and the temperature variation ratio of the resistance R3 when compared to cases in which ITO or IZO as inorganic transparent conductive materials is used as the materials of the detecting electrodes TDL. Namely, in a case where the various metallic materials as shown in Table 1 are used as the materials of the detecting electrodes TDL, the absolute value of the temperature coefficient of resistance of the entire time constant 3τ can be reduced when compared to cases in which the various transparent conductive materials as shown in Table 1 are used as the materials of the detecting electrodes TDL.

A sum of the resistance R3 as the ON resistance of the buffer TFT elements Trb and the resistance R2 of the driving electrodes COML is defined to be resistance R6. At this time, since the resistance R2 of the driving electrodes COML is smaller than the resistance R3 as the ON resistance of the buffer TFT elements Trb, the temperature coefficient of resistance of the resistance R6 is negative similarly to the temperature coefficient of resistance of the resistance R3. That is, when the temperature coefficient of resistance of resistance R6 is negative, in a case where various metallic materials as shown in Table 1 are used as the materials of the detecting electrodes TDL, the absolute value of the temperature coefficient of resistance of the entire time constant 3τ can be reduced when compared to cases in which the various transparent conductive materials as shown in Table 1 are used as the materials of the detecting electrodes TDL.

In this respect, also in a case where the resistance R2 of the driving electrodes COML is larger than the resistance R3 as the ON resistance of the buffer TFT elements Trb, when the temperature coefficient of resistance of resistance R6 is negative, the absolute value of the temperature coefficient of resistance of the entire time constant 3τ can be reduced when using various metallic materials as shown in Table 1 as the materials of the detecting electrodes TDL.

Further, the above estimations of time constants when the detecting electrodes TDL have a mesh-like form are made upon considering all of the plurality of detecting electrodes TDL. Accordingly, the expression that the specific resistance ρ of the detecting electrodes TDL is not more than 40 μΩcm indicates that the specific resistance ρ of the plurality of detecting electrodes TDL as a whole is not more than 40 μΩcm, and the expression that the temperature coefficient of resistance of the detecting electrodes TDL is $1\times10^{-3}$ to $5\times10^{-3}K^{-1}$ indicates that the temperature coefficient of resistance of the plurality of detecting electrodes TDL as a whole is $1\times10^{-3}$ to $5\times10^{-3}K^{-1}$. However, when each of the specific resistances ρ of the plurality of detecting electrodes TDL is not more than 40 μΩcm, the specific resistance ρ of the plurality detecting electrodes TDL as a whole will also be not more than 40 μΩcm, and when each of the temperature coefficients of resistance of the plurality of detecting electrodes TDL is $1\times10^{-3}$ to $5\times10^{-3}K^{-1}$, the temperature coefficient of resistance of the plurality detecting electrodes TDL as a whole will also be $1\times10^{-3}$ to $5\times10^{-3}K^{-1}$. Accordingly, the expression that the specific resistance ρ of the detecting electrodes TDL is not more than 40 μΩcm includes cases in which each of the specific resistances ρ of the plurality of detecting electrodes TDL is not more than 40 μΩcm, and the expression that the temperature coefficient of resistance of the detecting electrodes TDL is $1\times10^{-3}$ to $5\times10^{-3}K^{-1}$ includes cases in which each of the temperature coefficients of resistance of the plurality detecting electrodes TDL is $1\times10^{-3}$ to $5\times10^{-3}K^{-1}$ (the same applies to cases of zigzag shape to be described later).

<Resistance of Detecting Electrodes of Zigzag Shape>

Next, estimations of resistances R5 of detecting electrodes TDL having a zigzag shape as shown in FIG. 10 and composed of the various materials shown in Table 1 were performed. Also in this case, estimations of resistances R5 of detecting electrodes TDL were performed using the above equation (2) and equation (3) similarly to the case the detecting electrodes TDL have a mesh-like shape as shown in FIG. 9. The results are shown in Table 4.

TABLE 4

| | MATERIAL OF DETECTING ELECTRODE TDL | RESISTANCE R5 OF DETECTING ELECTRODE TDL (Ω) |
| --- | --- | --- |
| COMPARATIVE EXAMPLE 8 | PEDOT | $29.7 \times 10^3$ |
| COMPARATIVE EXAMPLE 9 | IZO | $22.3 \times 10^3$ |
| COMPARATIVE EXAMPLE 10 | ITO | $19.3 \times 10^3$ |
| EXAMPLE 11 | Al | $6.50 \times 10^2$ |
| EXAMPLE 12 | Cu | $4.40 \times 10^2$ |
| EXAMPLE 13 | Ag ALLOY | $6.50 \times 10^2$ |
| EXAMPLE 14 | AlNd ALLOY | $1.60 \times 10^3$ |
| EXAMPLE 15 | STACKED ALLOY | $9.20 \times 10^3$ |

As shown in Table 4, cases in which various materials of PEDOT as an organic transparent conductive material and ITO and IZO as inorganic transparent conductive materials are used as materials of the detecting electrodes TDL are defined as Comparative Example 8 to Comparative Example 10. Further, cases in which detecting electrodes TDL having a zigzag form as shown in FIG. 10 are provided by using various metallic materials of Al, Cu, an Ag alloy, an AlNd alloy and a stacked alloy as materials of the detecting electrodes TDL are defined as Example 11 to Example 15. At this time, the area ratios rs of Example 11 to Example 15 were defined to be 5%. The detecting electrodes TDL composed of a stacked alloy in Example 15 correspond to the detecting electrodes TDL of a structure explained using, for instance, FIG. 13 and FIG. 14.

When the detecting electrodes TDL have a zigzag form, the number of detecting electrodes TDL is less than that when detecting electrodes TDL have a mesh-like form. However, when the detecting electrodes TDL have a zigzag form, it is possible to increase the width of the detecting electrodes TDL when compared to cases in which the detecting electrodes TDL have a mesh-like form. Accordingly, the area ratio of detecting electrodes TDL having a zigzag form can be made equivalent to the area ratio of the detecting electrodes TDL having a mesh-like form.

The film thicknesses d of Example 11 to Example 15 were defined to be substantially equal to the film thicknesses d of Comparative Example 8 to Comparative Example 10.

As shown in Table 4, the resistances R5 of the detecting electrodes of Example 11 to Example 15 can be made smaller than the resistances R5 of the detecting electrodes TDL of Comparative Example 8 to Comparative Example 10.

In this respect, since the detecting electrodes composed of materials used in Comparative Example 8 to Comparative Example 10 are composed of a transparent conductive film and can be arranged to overlap the sub-pixels SPix when seen in a plan view, the area ratios rs of Comparative Example 8 to Comparative Example 10 are defined to be larger values than the area ratios rs of Example 11 to Example 15. However, similarly to the explanations made using Table 2, it does not affect size relations of resistances R5 among Example 11 to Example 15 and Comparative Example 8 to Comparative Example 10.

<Time Constants of Detecting Electrodes of Zigzag Form>

Next, results of estimating time constants when the detecting electrodes TDL have a zigzag form as shown in FIG. 10 will be explained with reverence to Table 5.

Here, estimations of time constants of electric circuits including driving electrodes COML and detecting electrodes TDL and of temperature variation ratios of time constants were performed based on the above equation (1), resistances R1 to R5 and electrostatic capacities C11 to C15. At this time, resistances R1 to R4 and electrostatic capacities C11 to C14 from among resistances R1 to R5 and electrostatic capacities C11 to C15 were made constant. Then, estimations of time constants when only the resistance values and the temperature variation ratios of resistance R5 were changed by changing the materials of the detecting electrodes TDL were performed. The results are shown in Table 5. In Table 5, 3τ which is three times the time constant τ is shown as the time constant similarly to Table 3. In this respect, Table 5 shows the time constant 3τ in an optional unit standardized at a Certain value. Further, Table 5 shows variation ratios within a temperature range of 243 to 343K as temperature variation ratios of the time constant 3τ.

TABLE 5

|  | MATERIAL OF DETECTING ELECTRODE TDL | TIME CONSTANT 3τ (a.u.) | TEMPERATURE VARIATION RATIO OF TIME CONSTANT 3τ (%) |
|---|---|---|---|
| COMPARATIVE EXAMPLE 11 | PEDOT | 4.11 | −5.23 |
| COMPARATIVE EXAMPLE 12 | IZO | 3.57 | −0.81 |
| COMPARATIVE EXAMPLE 13 | ITO | 3.35 | −0.27 |
| EXAMPLE 16 | Al | 2.17 | 1.77 |
| EXAMPLE 17 | Cu | 2.16 | 1.79 |
| EXAMPLE 18 | AlNd ALLOY | 2.21 | 0.97 |
| EXAMPLE 19 | STACKED ALLOY ($\rho$ = 40 μΩcm, $\alpha$ = 1 × 10$^{-3}$ K$^{-1}$) | 2.59 | 0.04 |
| EXAMPLE 20 | STACKED ALLOY ($\rho$ = 40 μΩcm, $\alpha$ = 5 × 10$^{-3}$ K$^{-1}$) | 2.59 | 4.95 |
| COMPARATIVE EXAMPLE 14 | STACKED ALLOY ($\rho$ = 40 μΩcm, $\alpha$ = 1 × 10$^{-2}$ K$^{-1}$) | 2.59 | 10.5 |

As shown in Table 5, cases in which various materials of PEDOT as an organic transparent conductive material and ITO and IZO as inorganic transparent conductive materials are used as materials of the detecting electrodes TDL are defined as Comparative Example 11 to Comparative Example 13. Further, cases in which detecting electrodes TDL having a zigzag form as shown in FIG. 10 are provided by using various metallic materials of Al, Cu, and an AlNd alloy as materials of the detecting electrodes TDL are defined as Example 16 to Example 18. Further, from among stacked alloys having a specific resistance $\rho$ of 40 μΩcm, a case in which a stacked alloy having a temperature coefficient of resistance $\alpha$ of 1×10$^{-3}$K$^{-1}$ is used is defined to be Example 19, a case in which a stacked alloy having a temperature coefficient of resistance $\alpha$ of 5×10$^{-3}$K$^{-1}$ is used is defined to be Example 20, and a case in which a stacked alloy having a temperature coefficient of resistance $\alpha$ of 1×10$^{-2}$K$^{-1}$ is used is defined to be Comparative Example 14.

As shown in Table 5, the time constants 3τ of Example 16 to Example 18 are reduced by not less than 20% when compared to Comparative Example 13 in which the time constant 3τ is 3.35. Accordingly, when the specific resistance $\rho$ of the detecting electrodes TDL is not more than 40 μΩcm, the time constant 3τ can be reduced by not less than 20% when compared to cases in which the detecting electrodes TDL are composed of a transparent conductive film.

Further, as shown in Table 5, while the absolute value of the temperature variation ratio of the time constant 3τ of Comparative Example 14 exceeds 5%, the absolute values of the temperature variation ratios of the time constants 3τ of Example 19 and Example 20 are not more than 5%. Accordingly, when the specific resistance $\rho$ of the detecting electrodes TDL is not more than 40 μΩcm and the temperature coefficient of resistance $\alpha$ thereof is 1×10$^{-3}$ to 5×10$^{-3}$K$^{-1}$, the absolute value of the temperature variation ratio of the time constant 3τ within a temperature range of 243 to 343K can be reduced to not more than 5%.

<Main Features and Effects of the Present Embodiment>

In the display of the first embodiment, the temperature coefficient of resistance R6 which is a sum of the resistance R3 as the ON resistance of the buffer TFT elements Trb and the resistance R2 of the driving electrodes COML is negative. Further, each of the specific resistances of the plurality of detecting electrodes TDL is not more than 40 μΩcm and each of the temperature coefficients of resistance of the plurality of detecting electrodes TDL is 1×10$^{-3}$ to 5×10$^{-3}$K$^{-1}$. With this arrangement, the time constant 3τ of the electric circuit including the driving electrodes COML and the detecting electrodes TDL can be reduced by not less than 20% when compared to cases in which the detecting electrodes TDL are composed of a transparent conductive film, and the absolute value of the temperature variation ratio of the time constant 3τ within a temperature range of 243 to 343K can be reduced to not more than 5%.

By reducing the time constant 3τ by not less than 20%, it is possible to increase the number of waveforms of the alternating rectangular waves Sg as the driving signals Vcom input to the driving electrodes TDL within a predetermined period of time. Accordingly, since delays will be hardly generated in signals output to the detecting electrodes in accordance with signals input to the driving electrodes and the number of waveforms of signals input to the driving electrodes within a predetermined period of time can be increased, it is possible to improve the detection performance of the input device.

Further, by reducing the absolute value of the temperature variation ratio of the time constant 3τ within a temperature range of 243 to 343K to not more than 5%, it is possible to reduce not only time constants at room temperature but also time constants at temperatures apart from room temperature. Accordingly, it is possible to maintain the time constant over the entire range of temperature ranges in which the display is used to be constant, thereby achieving improvements in reliability of the input device.

In this respect, there are cases in which the resistance R2 of the driving electrodes TDL is larger than the resistance R3 as the ON resistance of the buffer TFT elements Trb, and depending on types of materials of the driving electrodes COML, the temperature coefficient of resistance of resistance R2 of the driving electrodes COML might be negative. Also in such cases, it is possible to set the negative temperature dependency of resistance R2 of the driving electrodes COML off by the positive temperature dependency of resistance R5 of the detecting electrodes TDL by defining each of the specific resistances of the plurality of detecting electrodes TDL to be not more than 40 μΩcm and each of the temperature coefficients of resistance of the plurality of detecting electrodes TDL to be 1×10$^{-3}$ to 5×10$^{-3}$K$^{-1}$.

Accordingly, the time constant 3τ of the electric circuit including the driving electrodes COML and the detecting electrodes TDL can be reduced by not less than 20% when compared to cases in which the detecting electrodes TDL are composed of a transparent conductive film, and the absolute value of the temperature variation ratio of the time constant 3τ within a temperature range of 243 to 343K can be reduced to not more than 5%.

(Second Embodiment)

In the first embodiment, the driving electrodes were provided on the array substrate and the detecting electrodes were provided on the opposing substrate. In contrast thereto, in the second embodiment, while the driving electrodes are provided on the array substrate similarly to the first embodiment, unlike the first embodiment, the detecting electrodes are provided on a touch panel substrate provided on the opposite side of the array substrate with the opposing substrate being interposed therebetween.

Figure 29:
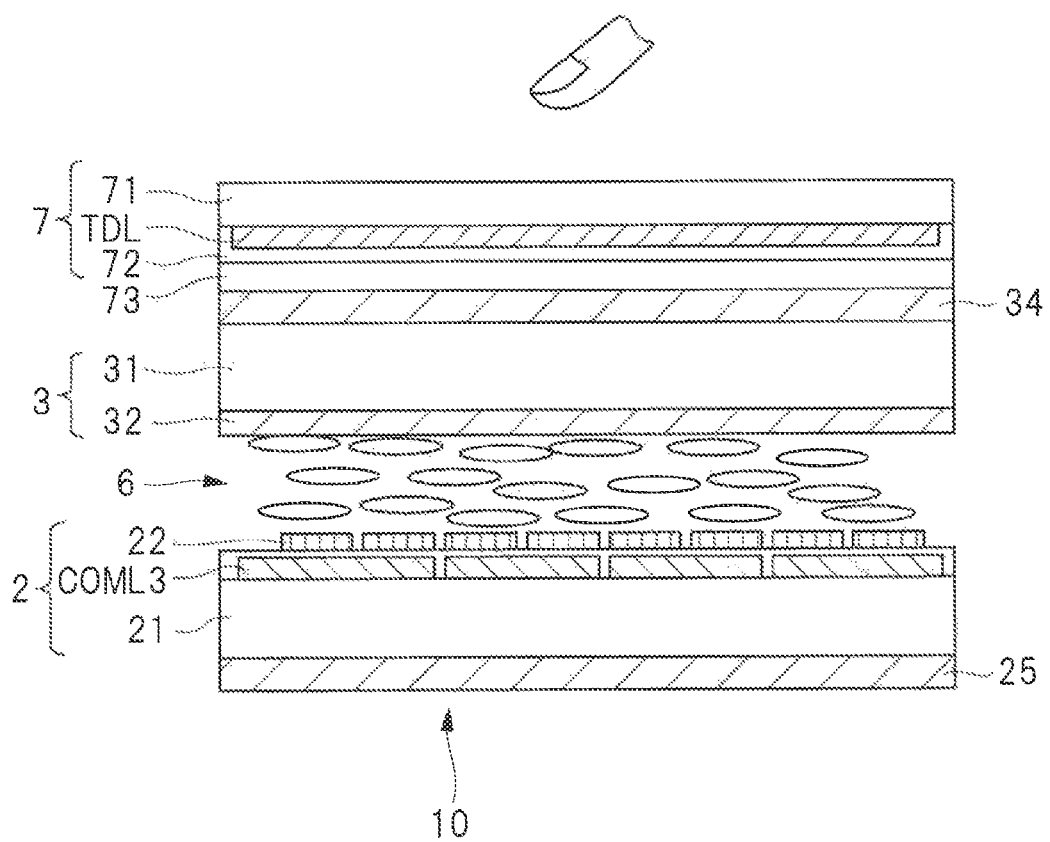
FIG. 29 A cross-sectional view showing an example of a configuration of a display according to a second embodiment.

FIG. 29 is a cross-sectional view showing an example of a configuration of a display according to the second embodiment.

The display device with touch detection functions 10 includes an array substrate 2, an opposing substrate 3 and a liquid crystal layer 6. The opposing substrate 3 is arranged to oppose in a direction perpendicular to a surface of the array substrate 2. The liquid crystal layer 6 is provided between the array substrate 2 and the opposing substrate 3.

As for the array substrate 2 and the liquid crystal layer 6 of the display according to the second embodiment, they are similar to the respective portions of the array substrate 2 and the liquid crystal layer 6 of the display according to the first embodiment, and explanations thereof will be omitted.

In the second embodiment, the opposing substrate 3 includes a transparent substrate 31 and a color filter 32. The color filter 32 is formed on a lower surface as one main surface of the transparent substrate 31. In this respect, as shown in FIG. 29, it is possible to provide a polarizing plate 25 on an opposite side of the opposing substrate 3 with the array substrate 2 being interposed therebetween. Further, it is also possible to provide a polarizing plate 34 on an opposite side of the array substrate 2 with the opposing substrate 3 being interposed therebetween.

In the second embodiment, unlike the first embodiment, a touch panel substrate 7 is provided on the opposite side of the array substrate 2 with the opposing substrate 3 being interposed therebetween. Accordingly, the touch panel substrate 7 is provided to overlap the array substrate 2 when seen in a plan view and it is provided to oppose the array substrate 2 with the opposing substrate 3 being interposed therebetween. In this respect, the polarizing plate 34 is provided between the opposing substrate 3 and the touch panel substrate 7.

The touch panel substrate 7 includes a transparent substrate 71, detecting electrodes TDL and a protection film 72. The detecting electrodes TDL are detecting electrodes of the touch detection device 30 and are formed on a lower surface as one main surface of the transparent substrate 71. The protection film 72 is formed on the lower surface of the transparent substrate 71 to cover the detecting electrodes TDL. The shape and arrangement of the detection electrodes TDL when seen in a plan view might be similar to the shape and arrangement of the detection electrodes TDL according to the first embodiment when seen in a plan view.

The touch panel substrate 7 is arranged to oppose the opposing substrate 3 such that a lower surface of the touch panel substrate 7 and an upper surface of the opposing substrate 3 oppose each other. Further, an adhesive material 73 is arranged between the protection film 72 formed on the lower surface of the touch panel substrate 7 and the polarizing plate 34, and the touch panel substrate 7 and the opposing substrate 3 are adhered by means of the adhesive material 73.

<Main Features and Effects of the Present Embodiment>

Also in the display according to the second embodiment, the temperature coefficient of resistance of resistance R6 which is a sum of the resistance R3 as the ON resistance of the buffer TFT elements Trb and the resistance R2 of the driving electrodes COML is negative similarly to the display according to the first embodiment. Further, each of the specific resistances of the plurality of detecting electrodes TDL is not more than 40 μΩcm and each of the temperature coefficients of resistance of the plurality of detecting electrodes TDL is $1\times10^{-3}$ to $5\times10^{-3}K^{-1}$. With this arrangement, the time constant 3τ of the electric circuit including the driving electrodes COML and the detecting electrodes TDL can be reduced by not less than 20% when compared to cases in which the detecting electrodes TDL are composed of a transparent conductive film, and the absolute value of the temperature variation ratio of the time constant 3τ within a temperature range of 243 to 343K can be reduced to not more than 5%. Namely, as for the time constant 3τ and the temperature variation ratio of the time constant 3τ within a temperature range of 243 to 343K, the same effects as those of the first embodiment can be achieved.

Further, unlike the first embodiment, in the second embodiment, the detecting electrodes TDL are provided on the touch panel substrate 7 arranged on the opposite side of the array substrate 2 with the opposing substrate 3 being interposed therebetween. With this arrangement, various conditions of manufacture in steps of forming the detecting electrodes TDL are not restricted by the heat resistance temperature of, for instance, the color filter 32 formed on the opposing substrate 3. Therefore, effects can be achieved in that, for instance, the variation of metallic materials which can be used as the various metallic materials included in the detecting electrodes TDL is increased.

In the foregoing, the invention made by the inventors of the present invention has been concretely described based on the embodiments. However, it is needless to say that the present invention is not limited to the foregoing embodiments and various modifications and alterations can be made within the scope of the present invention.

Further, in the foregoing embodiments, the cases of a liquid crystal display device have been illustrated as disclosure examples, but all kinds of flat-panel display devices such as an organic EL display device, other self-luminous type display devices and electronic paper display devices having electrophoresis elements may be listed as other application examples. Further, it goes without saying that the present invention is applicable to small, medium and large sized devices without any particular limitation.

In the category of the idea of the present invention, a person with ordinary skill in the art can conceive various modified examples and revised examples, and such modified examples and revised examples are also deemed to belong to the scope of the present invention.

For example, the examples obtained by appropriately making the additions, deletions or design changes of components or the additions, deletions or condition changes of processes to respective embodiments described above by a person with ordinary skill in the art also belong to the scope of the present invention as long as they include the gist of the present invention.

INDUSTRIAL APPLICABILITY

The present invention is effective when applied to displays.

EXPLANATION OF ELEMENT REFERENCES

1: Display
2: Array Substrate
3: Display
4: Opposing Substrate
6: Liquid Crystal Layer
7: Touch Panel Substrate
10: Display Device with Touch Detection Functions
11: Control Unit
12: Gate Driver
13: Source Driver
14: Driving Electrode Driver
19: COG
20: Liquid Crystal Display Device (Display Device)
21: Transparent Substrate
22: Pixel Electrode
24: Insulating Film
25: Polarizing Plate
30: Touch Detection Device
31: Transparent Substrate
32: Color Filter
32B, 32G, 32R: Color Region
33: Protection Film
34: Polarizing Plate
40: Touch Detection Unit
42: Touch Detecting Signal Amplification Unit
43: A/D Conversion Unit
44: Signal Processing Unit
45: Coordinate Extracting Unit
46: Detection Timing Control Unit
71: Transparent Substrate
72: Protection Film
73: Adhesive Material
Ad: Display Region
C1: Capacitive Element
C11, C12, C15, C2: Electrostatic Capacity
Cap: Capacity
CF1: Conductive Film
CL1 to CL4: Conductive Layer
COML: Driving Electrode
D: Dielectric Body
DET: Voltage Detector
E1: Driving Electrode
E2: Detecting Electrode
GCL: Scanning Line
GL1: Grounding Line
LC: Liquid Crystal Element
ML1 to ML3: Conductive Line
Pix: Pixel
R1 to R5: Resistance
Reset: Period
S: Alternating Signal Source
Scan: Scanning Direction
Sg: Alternating Rectangular Wave
SGL: Signal Line
SL1 to SL3: Stacked Film
Spix: Sub-Pixel
T: Terminal Unit
TDL: Detecting Electrode
Tr: TFT Element
Trb: Buffer TFT Element
Vcom: Driving Signal
Vdd: Power Source
Vdet: Detecting Signal
Vdisp: Video Signal
Vout: Signal Output
Vpix: Pixel Signal
Vscan: Scanning Signal
Vsig: Image Signal
WR1, WR2: Routing Wiring

The invention claimed is:

1. A display apparatus comprising:
a first substrate;
a second substrate arranged to oppose the first substrate;
pixels provided on the first substrate;
first electrodes provided on the first substrate along a first direction when seen in a plan view;
a transistor provided on the first substrate and serially connected to the first electrodes; and
second electrodes provided on the second substrate to respectively intersect with the first electrodes when seen in the plan view and aligned in the first direction,
wherein input positions are detected based on electrostatic capacities between each of the first electrodes and the second electrodes,
a temperature coefficient of resistance of a first resistance which is a sum of an ON resistance of the transistor and a resistance of the first electrodes is negative,
each of specific resistances of the second electrodes is not more than 40 $\mu\Omega$cm,
each of temperature coefficients of resistance of the second electrodes is $1\times10^{-3}$ to $5\times10^{-3} K^{-1}$,
each of the second electrodes includes a stacked layer in which a first conducive layer and a second conductive layer are stacked on a main surface of the second substrate,
the first conductive layer is composed of a first metallic material and the second conductive layer is composed of a second metallic material having a melting point higher than that of the first metallic material, and
the second conductive layer has a higher Young's modulus than the first conductive layer.

2. The display apparatus according to claim 1, wherein the ON resistance of the transistor is larger than the resistance of the first electrodes, and
a temperature coefficient of resistance of the ON resistance is negative.

3. The display apparatus according to claim 1, wherein from among the pixels, pixels include third electrodes respectively provided within each of the pixels aligned in the first direction, and
images are displayed through electric fields formed between each of the third electrodes and the first electrodes.

* * * * *